United States Patent
Malhan et al.

(10) Patent No.: US 11,573,284 B2
(45) Date of Patent: *Feb. 7, 2023

(54) METHODS, APPARATUSES, SYSTEMS, AND COMPUTER PROGRAM PRODUCTS FOR MULTI-POINT SHUNT CALIBRATION

(71) Applicant: Honeywell International Inc., Charlotte, NC (US)

(72) Inventors: Vishal Malhan, Dublin, OH (US); Raghavendra Shenoy, Karnataka (IN); Brian Richards, Upper Arlington, OH (US)

(73) Assignee: Honeywell International Inc., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/646,953

(22) Filed: Jan. 4, 2022

(65) Prior Publication Data
US 2022/0128642 A1  Apr. 28, 2022

Related U.S. Application Data

(63) Continuation of application No. 16/394,273, filed on Apr. 25, 2019, now Pat. No. 11,249,164.

(51) Int. Cl.
G08C 23/04 (2006.01)
G01D 18/00 (2006.01)
G01R 35/02 (2006.01)

(52) U.S. Cl.
CPC ........... *G01R 35/02* (2013.01); *G01D 18/002* (2013.01); *G01D 18/008* (2013.01); *G08C 23/04* (2013.01); *G01D 2218/10* (2021.05)

(58) Field of Classification Search
CPC .... G01R 35/02; G01D 18/002; G01D 18/008; G01D 2218/10; G08C 23/04
See application file for complete search history.

(56) References Cited

U.S. PATENT DOCUMENTS

| 4,627,296 A | * | 12/1986 | Morgan | ................ G01L 3/108 |
| | | | | 73/862.325 |
| 5,355,129 A | | 10/1994 | Baumann | |
| 9,234,768 B2 | | 1/2016 | Pradhan et al. | |

FOREIGN PATENT DOCUMENTS

| KR | 10-2006-0025771 A | 3/2006 | |
| KR | 20060025771 | * 3/2006 | ............... G01B 7/16 |

OTHER PUBLICATIONS

"TorqueTrak 10K-LP Torque Telemetry System: User Guide", Binsfeld Engineering, Nov. 26, 2018 (Year: 2018).*

(Continued)

*Primary Examiner* — Regis J Betsch
(74) *Attorney, Agent, or Firm* — Alston & Bird LLP

(57) ABSTRACT

Embodiments of the present disclosure include methods, apparatuses, systems, and computer program product for enabling multi-point shunt calibration of a sensor device. Multi-point shunt calibration provides at least a first, second, and third simulated calibration output, each simulated calibration output corresponding to an actual reading value and an expected reading value. The simulated calibration outputs are associated with a predefined output sequence, where each simulated calibration output is separated from an adjacent simulated calibration output by an output step size. Some embodiments are configured for automatically outputting each simulated calibration output for a particular period of time before outputting an adjacent simulated calibration output in the predefined output sequence. The various simulated calibration outputs, actual reading values, and/or expected values may be used in determining calibrated reading values for the sensor device.

20 Claims, 9 Drawing Sheets

(56) References Cited

OTHER PUBLICATIONS

Kay et al., "A Practical Technique for Minimizing the Number of Measurements in Sensor Signal Conditioning Calibration", Texas Instruments Application Report SBOA111—Jun. 2005 (Year: 2005).*
Notice of Allowance received for U.S. Appl. No. 16/394,273, dated Oct. 4, 2021, 10 pages.

* cited by examiner

METHODS, APPARATUSES, SYSTEMS, AND COMPUTER PROGRAM PRODUCTS FOR MULTI-POINT SHUNT CALIBRATION

CROSS-REFERENCE TO RELATED APPLICATIONS

This application is a continuation of and claims priority to U.S. Non-Provisional application Ser. No. 16/394,273, filed Apr. 25, 2019, and titled "METHODS, APPARATUSES, SYSTEMS, AND COMPUTER PROGRAM PRODUCTS FOR MULTI-POINT SHUNT CALIBRATION," the contents of which are incorporated herein by reference in their entirety.

TECHNOLOGICAL FIELD

Embodiments of the disclosure relate, generally, to methods, apparatuses, systems, and computer program products for enabling multi-point shunt calibration of a sensor device

BACKGROUND

Current methods, systems, apparatuses, and computer program products for enabling shunt calibration of sensor devices exhibit a plurality of problems that make current systems inefficient, insufficient, and/or non-ideal in practical use. Through applied effort, ingenuity, and innovation, solutions to improve such methods, systems, apparatuses, and computer program products have been realized and are described in connection with embodiments of the present disclosure.

BRIEF SUMMARY

Provided herein is a multi-point shunt calibration apparatus, method, and system that may allow for calibration of a sensor device to a highly accurate degree across the entire operating range of the sensor device while detecting and/or addressing various problems. For example, multi-point shunt calibration may enable calibration of adjustable sensor parameters to address problems associated with non-linearity, hysteresis, dead zones, and the like. Multi-point shunt calibration may drive the sensor device with various simulated calibration outputs, the various simulated calibration outputs having various values, for example at least a first simulated calibration output (e.g., a lower boundary simulated calibration output), a second simulated calibration output (e.g., an intermediate simulated calibration output), and a third simulated calibration output (e.g., an upper boundary simulated calibration output). The various simulated calibration outputs may be associated with a predefined output sequence, such that the embodiments provide each simulated calibration output in a particular order, either automatically or based on engagement from a user/operator. Each simulated calibration output may be associated with a corresponding actual reading value produced by the sensor device, and an expected reading value. Problems with the sensor device may be identified, detected, and/or addressed based on the simulated calibration output(s), the actual reading value(s), the expected reading value(s), or a combination thereof. For instance, the various actual reading values and/or expected reading values may be utilized to generate a calibrated lookup table associated with the sensor, for use in generating calibrated reading values. Alternatively, a calibrated reading value for the sensor device may be determined by taking into account any deviation found between the first, second, and third actual reading values or deviation between the actual reading values and corresponding expected reading values. Alternatively or additionally, one or more calibrated parameter values may be generated for one or more adjustable sensor parameters associated with the sensor device, which may be used to determine a calibrated reading value for the sensor device or calibrate the sensor device to produce calibrated reading values.

Embodiments provided herein are directed to a multi-point shunt calibration apparatus. The multi-point shunt calibration apparatus comprises a calibration component in communication with a sensor device. The calibration component may be configured to output a first simulated calibration output; output a second simulated calibration output after a first period of time following output of the first simulated calibration output; and output a third simulated calibration output after a second period of time following output of the second simulated calibration output. The first, second, and third simulated calibration outputs may be associated with a predefined output sequence within an operating range associated with the sensor device. The first, second, and third simulated calibration outputs may each cause the sensor device to produce a first, second, and third actual reading value, respectively. The first simulated calibration output may be separated from the second simulated calibration output by a first output step size, and the second simulated calibration output may be separated from the third simulated calibration output by a second output step size.

In some embodiments, the calibration component comprises a plurality of optocouplers; a plurality of output adjustment switches, each output adjustment switch associated with an optocoupler of the plurality of optocouplers; a plurality of fixed resistors, each fixed resistor associated with an output adjustment switch of the plurality of output adjustment switches. The plurality of optocouplers corresponds to a plurality of calibration input values, each calibration input value associated with activating at least one of the plurality of optocouplers.

In some embodiments, the calibration component comprises a calibration switch or a calibration command control; a multi-point shunt calibration microcontroller configured to produce at least a first pulse width modulated calibration value associated with the first simulated calibration output, a second pulse width modulated calibration value associated with the second simulated calibration output, and a third pulse width modulated calibration value associated with the third; an RC filter; and an output driver.

In some embodiments, the calibration component comprises a calibration switch or a calibration command control; a multi-point shunt calibration microcontroller configured to produce at least a first interpretable calibration value associated with the first simulated calibration output, a second interpretable calibration value associated with the second simulated calibration output, and a third interpretable calibration value associated with the third simulated calibration output; a digital-to-analog converter; and an output driver.

In some embodiments, the calibration component comprises a calibration switch or a calibration command control, and the calibration component is configured to receive a calibration initialization signal; and receive a calibration deinitialization signal. The calibration component is configured for outputting the first simulated calibration output in response to the calibration initialization signal, and the calibration component stops outputting the third simulated calibration component in response to receiving the calibration deinitialization signal. The calibration initialization signal may be received in response to a first user engagement, and the calibration deinitialization signal may be received in response to a second user engagement.

In some embodiments, the calibration component receives an output adjustment signal, wherein the first period of time ends in response to receiving the output adjustment signal. The output adjustment signal may be received in response to engagement with a calibration switch or a calibration command control.

In some embodiments, the first period of time and/or second period of time are associated with one or more automatic output time shift interval(s). The first period of time may be associated with a first automatic output time shift interval, where the calibration component is configured to determine the first period of time satisfies the automatic output time shift interval, and output the second simulated calibration output in response.

In some embodiments, the calibration component comprises a hold input. The calibration component may receive a hold initialization signal in response to a first user engagement with the hold input; and continue outputting a presently outputted simulated calibration output. The presently outputted simulated calibration output may be dependent on where the calibration component is in the predefined output sequence, and may be the first simulated calibration output, the second simulated calibration output, or the third simulated calibration output.

In some embodiments, the calibration component is further configured to repeat output of the first simulated calibration output, the second simulated calibration output, and the third simulated calibration output according to the predefined output sequence. Additional simulated calibration outputs may also be repeatedly output. The first, second, and third simulated calibration outputs may be associated with a predefined output sequence within an operating range associated with a sensor device. The first, second, and third simulated calibration outputs may each cause the sensor device to produce a first, second, and third actual reading value, respectively. The first simulated calibration output may be separated from the second simulated calibration output by a first output step size, and the second simulated calibration output may be separated from the third simulated calibration output by a second output step size.

Additional embodiments provided herein are directed to a multi-point shunt calibration method. The method includes outputting a first simulated calibration output; outputting a second simulated calibration output after a first period of time following outputting of the first simulated calibration output; and outputting a third simulated calibration output after a second period of time following outputting of the second simulated calibration output. The first, second, and third simulated calibration outputs are associated with a predefined output sequence within an operating range associated with a sensor device. The first simulated calibration output, the second simulated calibration output, and the third simulated calibration output may be configured to cause the sensor device to produce a first, second, and third reading value, respectively. The first simulated calibration output may be separated from the second simulated calibration output by a first output step size, and the second simulated calibration output is separated from the third simulated calibration output by a second output step size.

In some embodiments, outputting the first, second, and third simulated calibration outputs utilizes a plurality of optocouplers, a plurality of output adjustment switches, and a plurality of fixed resistors, where each output adjustment switch of the plurality of output adjustment switches is controlled based on an optocoupler of the plurality of optocouplers, and where each fixed resistor of the plurality of fixed resistors is associated with an output adjustment switch of the plurality of output adjustment switches, and where the plurality of optocouplers corresponds to a plurality of calibration input values, each calibration input value associated with activation of at least one of the plurality of optocouplers.

In some embodiments, outputting the first, second, and third simulated calibration output comprises outputting an interpretable calibration value from a multi-point shunt calibration microcontroller to a digital-analog converter; outputting a converted calibration signal based on the interpretable calibration value from the digital-to-analog converter to an output driver, where the output driver outputs the simulated calibration output based on the converted calibration signal.

In some embodiments, outputting the first, second, and third simulated calibration output comprises outputting a pulse width modulated calibration value from a multi-point shunt calibration microcontroller to a RC filter; outputting a filtered calibration signal based on the pulse width modulated calibration value from the RC filter to the output driver, where the output driver outputs the simulated calibration output based on the filtered calibration signal.

In some embodiments, the method further comprises receiving a calibration initialization signal in response to a first user engagement with a calibration switch or a calibration command control, wherein outputting the first simulated calibration output is in response to receiving the calibration initialization signal; receiving a calibration deinitialization signal in response to a second user engagement with the calibration switch or the calibration command control; and stopping outputting the third simulated calibration output in response to the calibration deinitialization signal.

In some embodiments, the method further includes receiving an output adjustment signal, where the first period of time ends in response to receiving the output adjustment signal. In some embodiments, the method further includes receiving a second output adjustment signal, where the second period of time ends in response to receiving the second output adjustment signal.

In some embodiments, the first time period is associated with an automatic output time shift interval, where the method further includes determining the first period of time that satisfies the automatic output time shift interval. In some embodiments, the method further includes repeating outputting of the first simulated calibration output, the second simulated calibration output, and the third simulated calibration output according to the predefined output sequence.

In some embodiments, the method further includes generating a calibration lookup table associated with the sensor device based on at least a first, second, and third actual reading values associated with the first, second, and third simulated calibration output, respectively.

Additional embodiments provided herein are directed to a multi-point shunt calibration system. The system comprises a measuring bridge circuit. The system may additionally include a calibration component in communication with the sensor device, the calibration component configured to output a first simulated calibration output; output a second simulated calibration output after a first period of time following output of the first simulated calibration output; and output a third simulated calibration output after a second period of time following output of the second simulated calibration output. The first, second, and third simulated calibration outputs may be associated with a predefined output sequence within an operating range associated with the sensor device. The first, second, and third simulated calibration outputs may be each configured to cause the sensor device to provide a first, second, and third actual reading value, respectively.

In some embodiments of the system, the calibration component comprises a calibration switch or calibration command control, and a multi-point shunt calibration microcontroller in communication a digital-to-analog converter, and an output driver in communication with the digital-to-analog converter. In some embodiments of the system, the calibration comprises a multi-point shunt microcontroller in communication with a RC filter, and an output driver in communication with the RC filter.

In some embodiments, the calibration component includes a multi-point shunt calibration circuit. The multi-point shunt calibration circuit may comprise a plurality of optocouplers, a plurality of output adjustment switches, and a plurality of fixed resistors. Each optocoupler, output adjustment switch, and fixed resistor may be associated with a calibration value input in a plurality of calibration value inputs, for example associated with a calibration switch or a calibration command control.

In some embodiments, the multi-point shunt calibration system includes a sensor adjustment component configured to determine a calibrated sensor parameter value for at least one adjustable sensor parameter associated with the sensor device. The calibrated sensor value may be based on at least the first actual reading value, the second actual reading value, and the third actual reading value.

In some embodiments, the predefined output sequence is associated with at least one additional simulated calibration output and the calibration component is further configured to output each of the at least one additional simulated calibration output for an additional period of time.

In some embodiments of the system, the calibration component is further configured to repeat output of the first simulated calibration output, the second simulated calibration output, and the third simulated calibration output according to the predefined output sequence. The calibration component may further repeat outputting one or more additional simulated calibration outputs.

In some embodiments, the first simulated calibration output is an initial simulated calibration output, the second simulated calibration output is an intermediate simulated calibration output, and the third simulated calibration output is a boundary simulated calibration output.

In some embodiments, each output step size is a percentage output step size associated with the operating range associated with the sensor device. Each output step size may be the same size. In other embodiments, various output step sizes may be different step sizes.

In some embodiments of the system, the system further includes a hold input, and the calibration component is further configured to receive a hold initialization signal in response to a first user engagement with the hold input, and continue outputting a presently outputted simulated calibration output, where the presently outputted simulated calibration output is one selected from the group of the first simulated calibration output, the second simulated calibration output, and the third simulated calibration output. In some embodiments, the hold input comprises an analog hold switch or a digital hold switch.

Additional embodiments provided herein are directed to a multi-point shunt calibration sensor device comprising a measuring bridge component; and a shunt calibration component configured to determine a first actual reading value associated with a first simulated calibration output; determine a second actual reading value associated with a second simulated calibration output; determine a third actual reading value associated with a third simulated calibration output; and determine a calibrated reading value associated with the measuring bridge component based on the first actual reading value, second actual reading value, and third actual reading value, wherein the first, second, and third simulated calibration outputs are associated with different expected reading values within an operating range of the multi-point shunt calibration sensor device. The shunt calibration component may be further configured to determine at least one additional actual reading value associated with at least one additional simulated calibration output, wherein the calibrated reading value is further based on the at least one additional actual reading value. The first, second, and third simulated calibration outputs may be associated with a predefined output sequence. The first, second, and third simulated calibration outputs may be associated with an automatic output shift time interval.

In some embodiments, the first actual reading value is associated with a first expected reading value, the second actual reading value is associated with a second expected reading value, and the third actual reading value is associated with a third expected reading value, and the calibrated reading value is based on a first error value based on the first actual reading value and the first expected reading value, a second error value based on the second actual reading value and the second expected reading value, and a third error value based on the third actual reading value and the third expected reading value.

In some embodiments, the calibrated reading value is determined at least using the formula:

$$\frac{\left(\text{Second Actual Reading Value} - \left(\frac{\text{First Actual Reading Value} + \text{Third Actual Reading Value}}{2}\right)\right) * 100}{\text{Third actual Reading Value} - \text{First Actual Reading Value}}.$$

For instance, the formula may be used to adjust the uncalibrated reading value to the calibrated reading value. In some embodiments, the formula may be used to determine a calibrated sensor parameter value for an adjustable sensor parameter. Such calibrated sensor parameter value may be used to adjust the sensor device or stored for future used in determining the calibrated reading value.

An embodiment multi-point shunt calibration sensor device is also provided for. In some embodiments, the multi-point shunt calibration sensor device includes at least a measuring bridge and a shunt calibration component. In some embodiments, the shunt calibration component may be configured to determine a first actual reading value associated with a first simulated calibration output; determine a second actual reading value associated with a second simulated calibration output; determine a third actual reading value associated with a third simulated calibration output; and determine a calibrated reading value based on the first actual reading value, second actual reading value, and third actual reading value, where the first, second, and third simulated calibration outputs are associated with different expected reading values within an operating range of the multi-point shunt calibration sensor device.

In some other embodiments, the shunt calibration component of the embodiment multi-point shunt calibration sensor device is further configured to determine at least one additional actual reading value associated with at least one additional simulated calibration output, where the calibrated reading value is further based on the at least one additional actual reading value.

In some embodiments of the multi-point shunt calibration sensor device, the first, second, and third simulated calibration outputs are associated with a predefined output sequence. In some embodiments of the multi-point shunt calibration sensor device, the first, second, and third simulated calibration outputs are associated with an automatic output shift time interval. In some embodiments of the multi-point shunt calibration sensor device, the first actual reading value is associated with a first expected reading value, the second actual reading value is associated with a second expected reading value, and the third actual reading value is associated with a third expected reading value, where the calibrated reading value is based on a first error value based on the first actual reading value and the first expected reading value, a second error value based on the second actual reading value and the second expected reading value, and a third error value based on the third actual reading value and the third expected reading value.

In some embodiments of the multi-point shunt calibration sensor device, the non-linearity of an actual reading value, which may be used to determine a calibrated reading value, is determined at least using the formula $$\frac{\left(\text{Sensor Output at 50\%} - \frac{\text{Sensor Output at 0\%} + \text{Sensor Output at 100\%}}{2}\right) * 100}{\text{Sensor Output at 100\%} - \text{Sensor Output at 0\%}}.$$

In some embodiments, the first actual reading value represents the sensor output at 0%, the second actual reading value represents the sensor output at 50%, and the third actual reading value represents the sensor output at 100%.

In some embodiments of the multi-point shunt calibration sensor device, the hysteresis of an actual reading value, which may be used to determine a calibrated reading value, is determined at least using the formula $$\frac{\left(\text{Sensor Output at 50\% Going Up} - \text{Sensor Output at 50\% Going Down}\right) * 100}{\text{Sensor Output at 100\%} - \text{Sensor Output at 0\%}}$$

associated with a predefined output sequence.

In some embodiments, the first actual reading value represents the sensor output at 0%, the second actual reading value represents the sensor output at 50% going up, the third actual reading value represents the sensor output at 100%, and a fourth actual reading value represents the sensor output at 50% going down.

In some embodiments, a computer program product is provided for. The computer program product may include a non-transitory computer-readable memory having program code instructions therein. The program code instructions may be configured to, when executed by a processor, perform one or more operations and/or methods. For example, the program code instructions may be configured to cause the processor to perform the steps of the computer-implemented methods, and/or operations thereof, discussed herein.

BRIEF DESCRIPTION OF THE DRAWINGS

Figure 1:
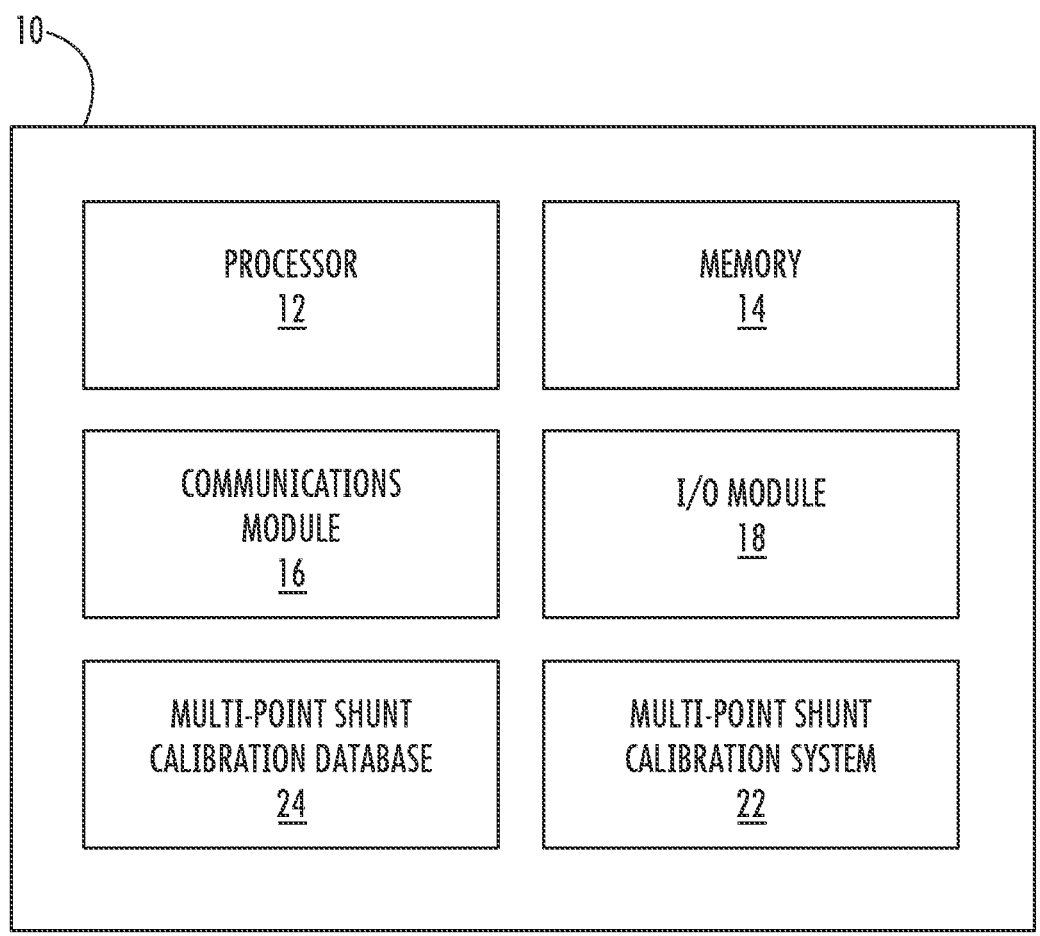
Figure 2:
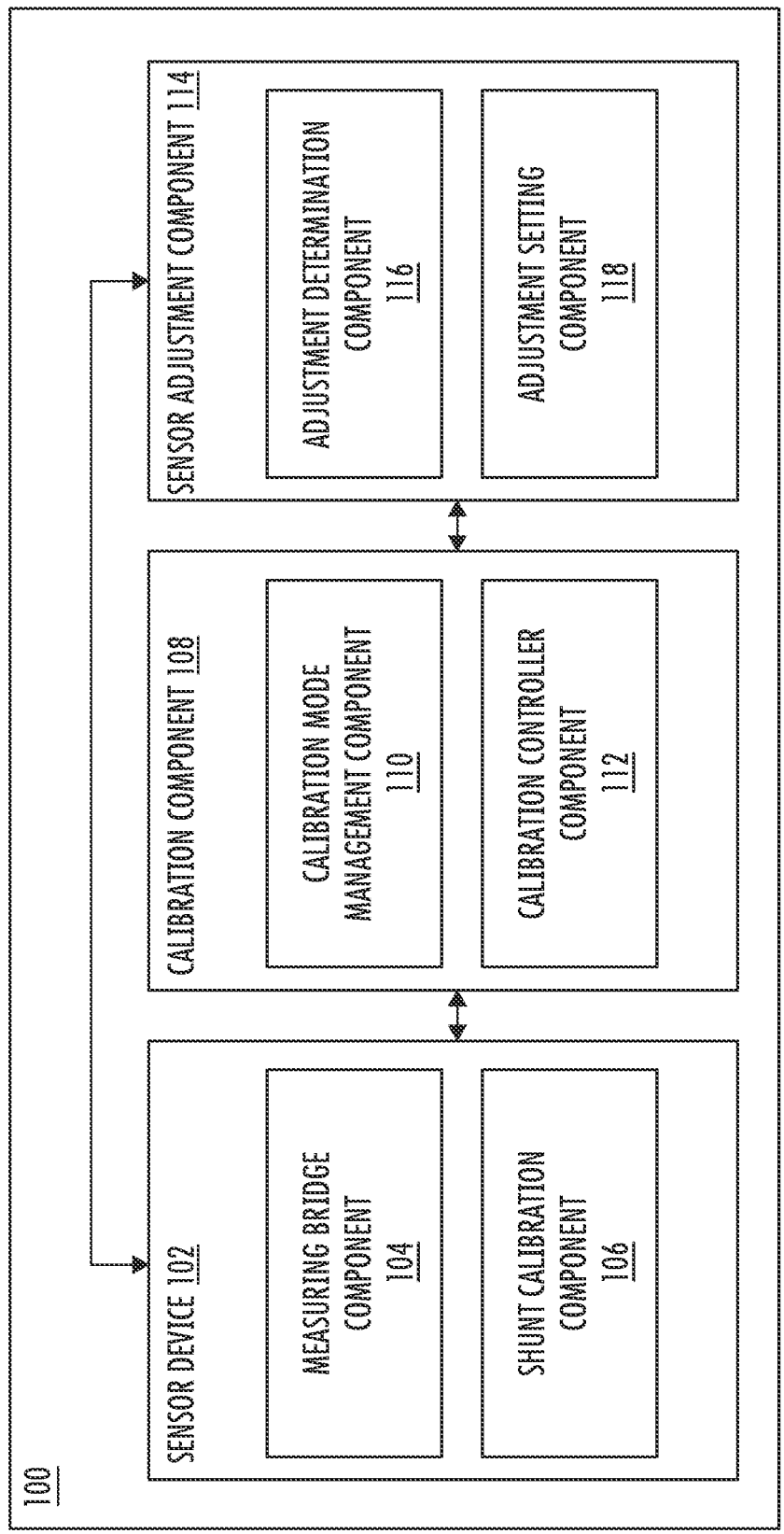
Figure 3:
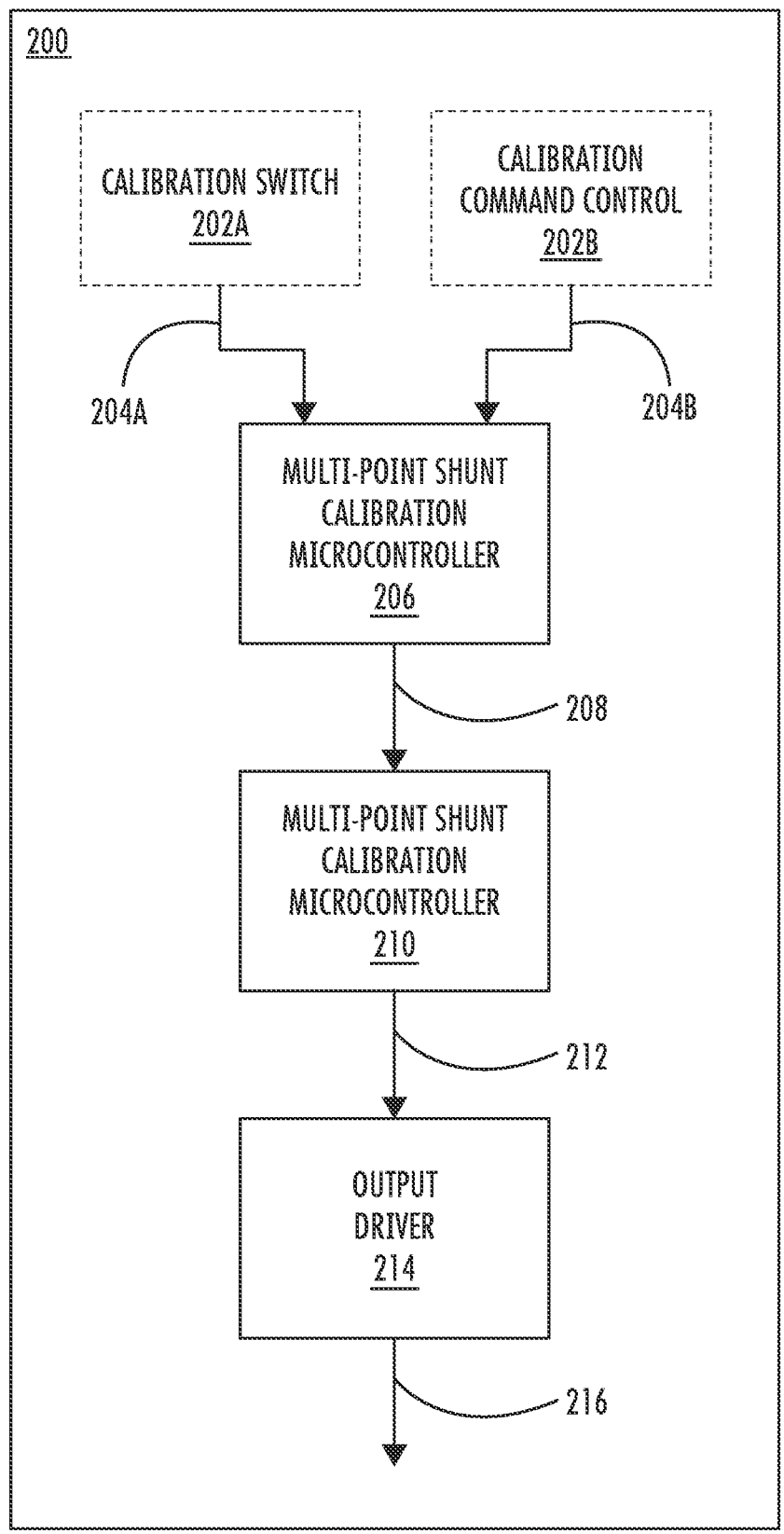
Figure 4:
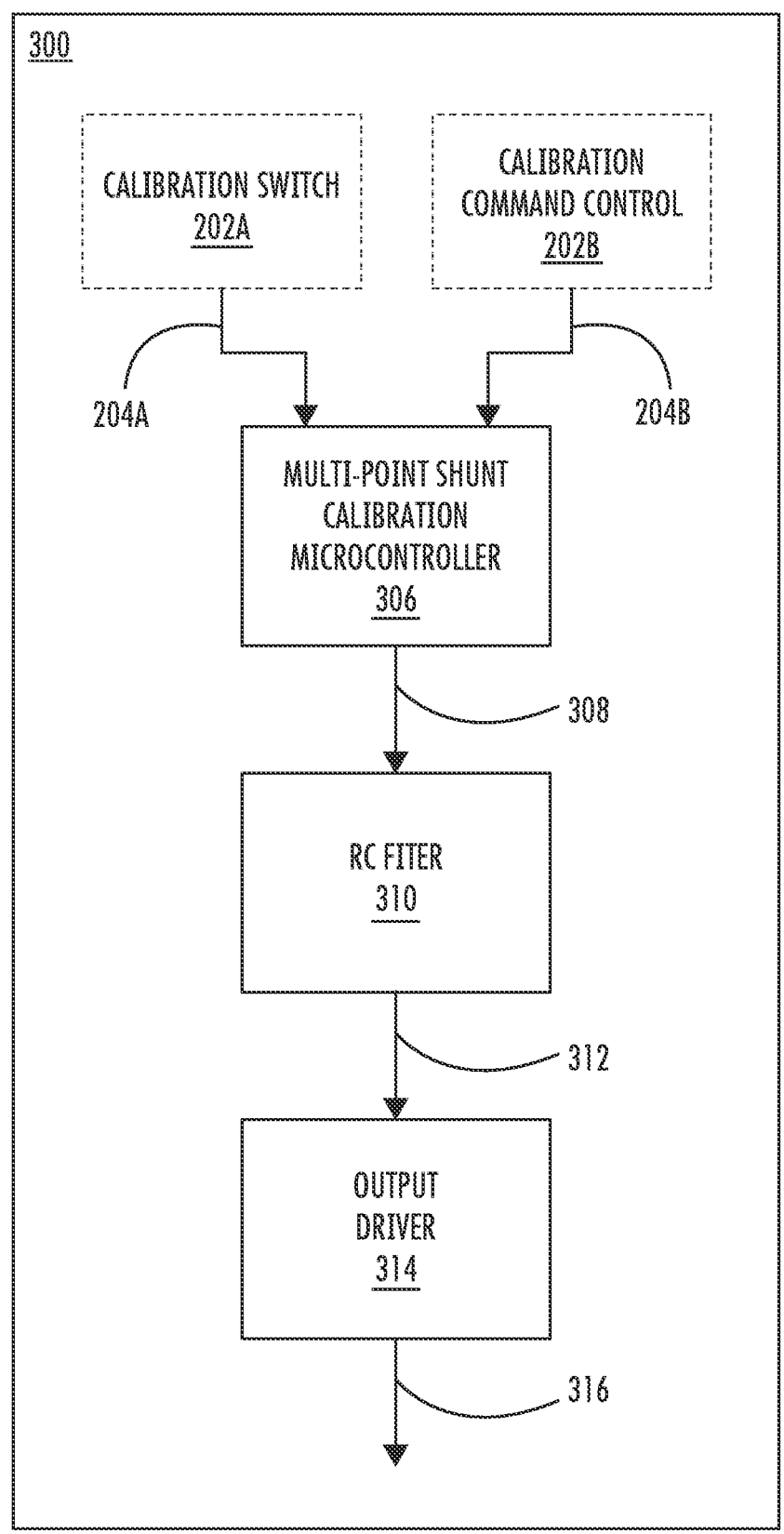
Figure 5:
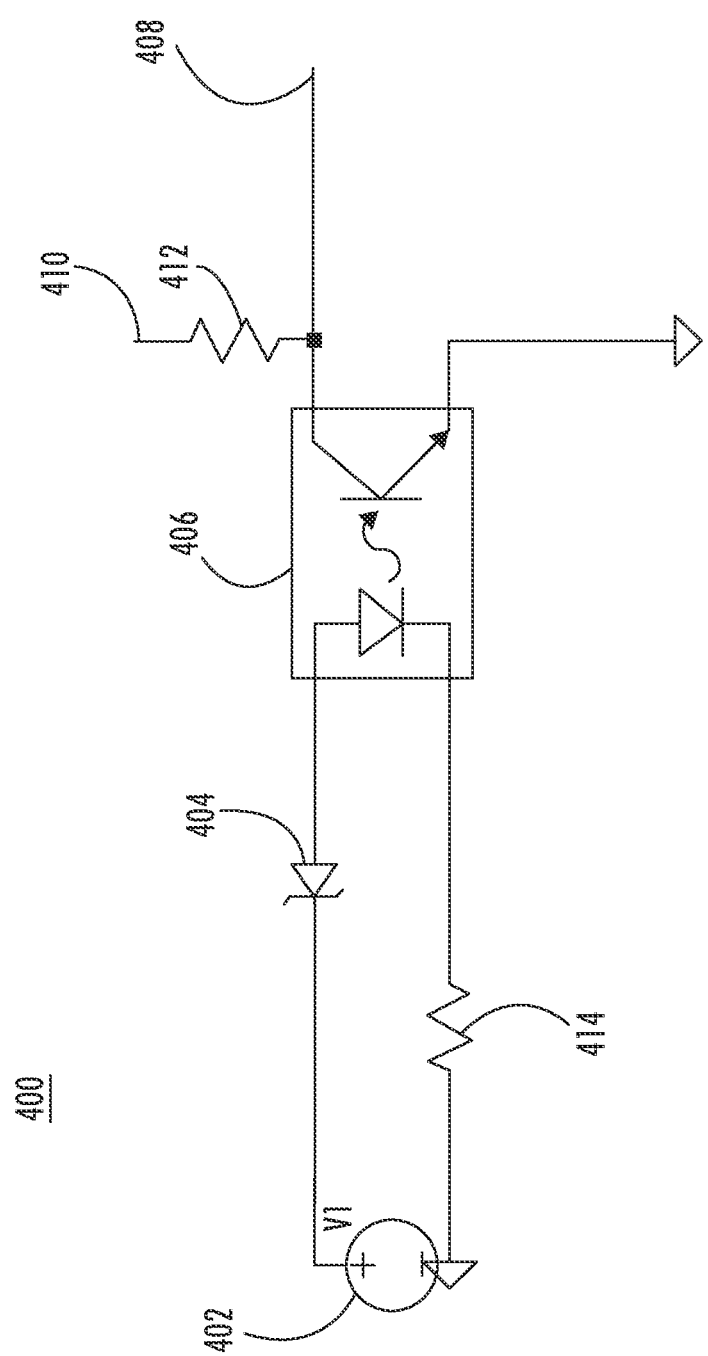
Figure 6:
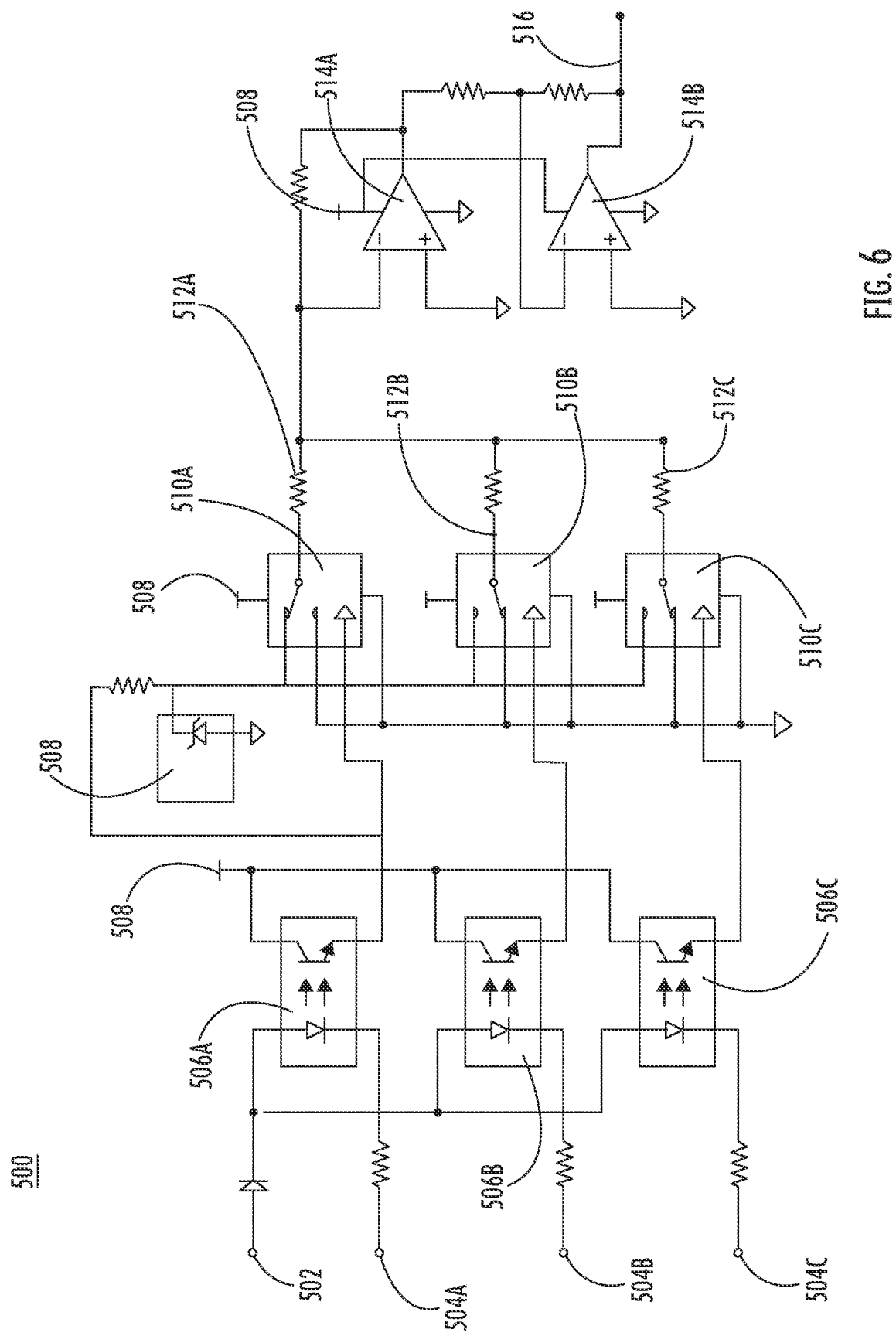
Figure 7:
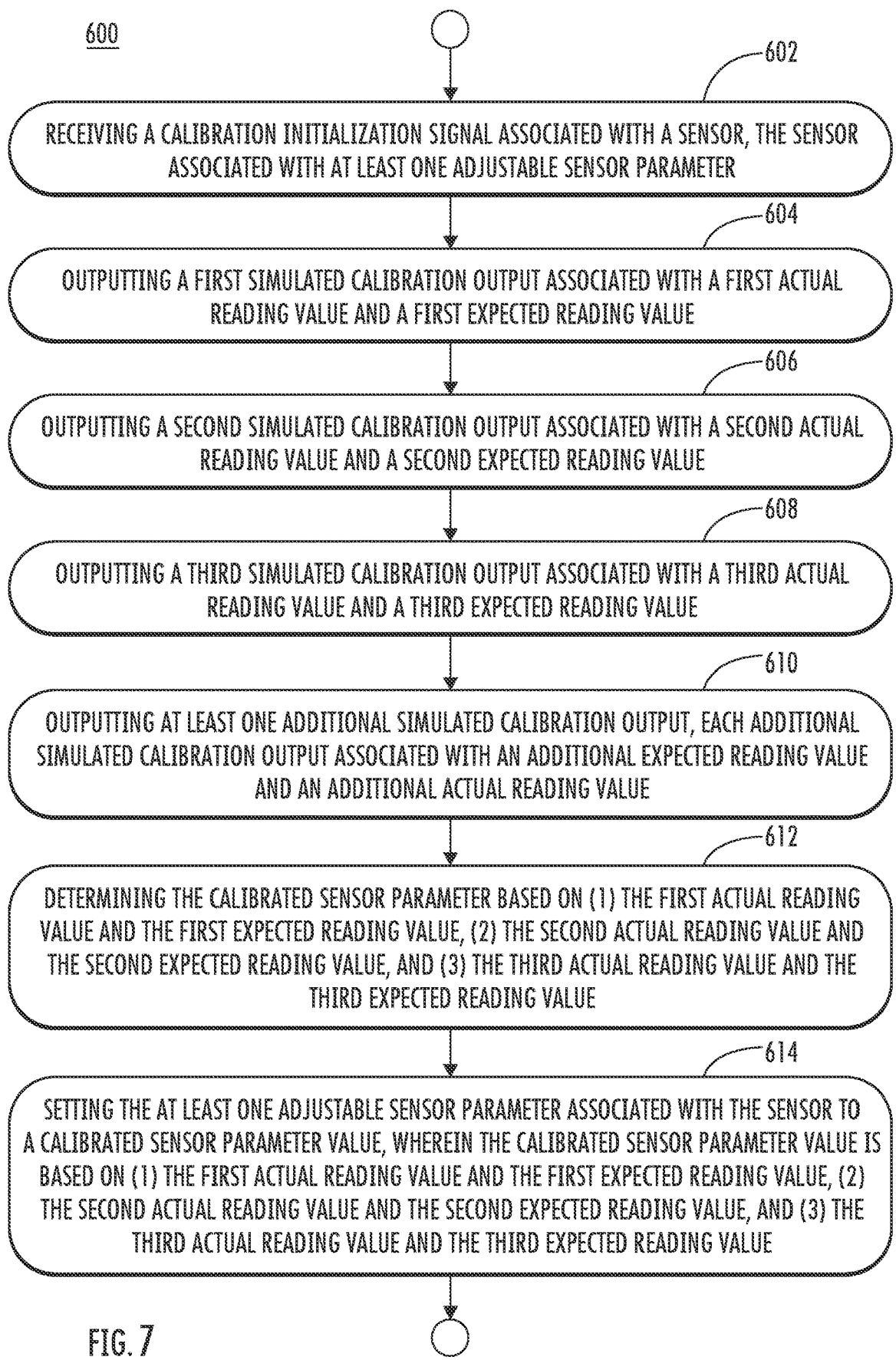
Figure 8:
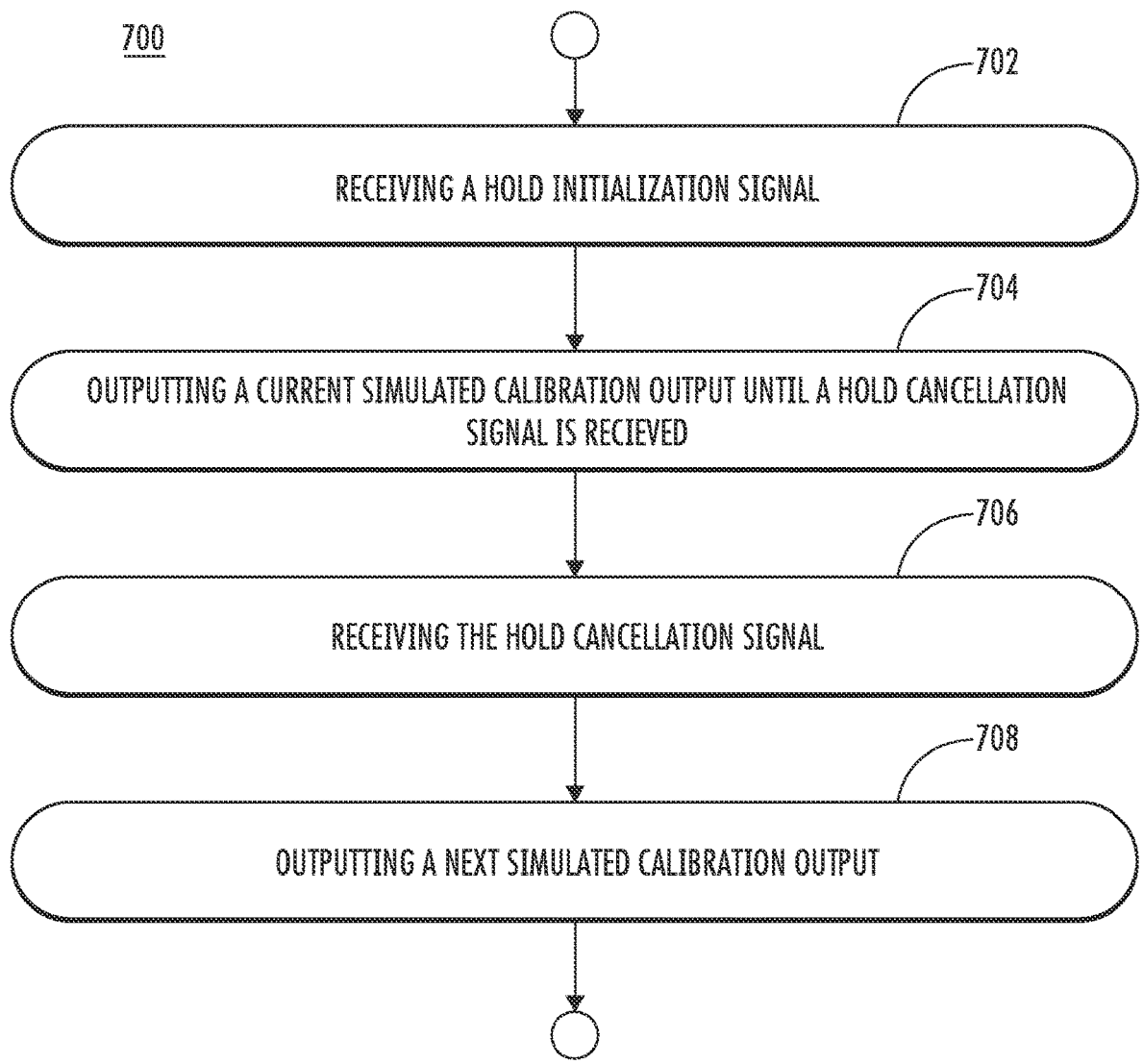
Figure 9:
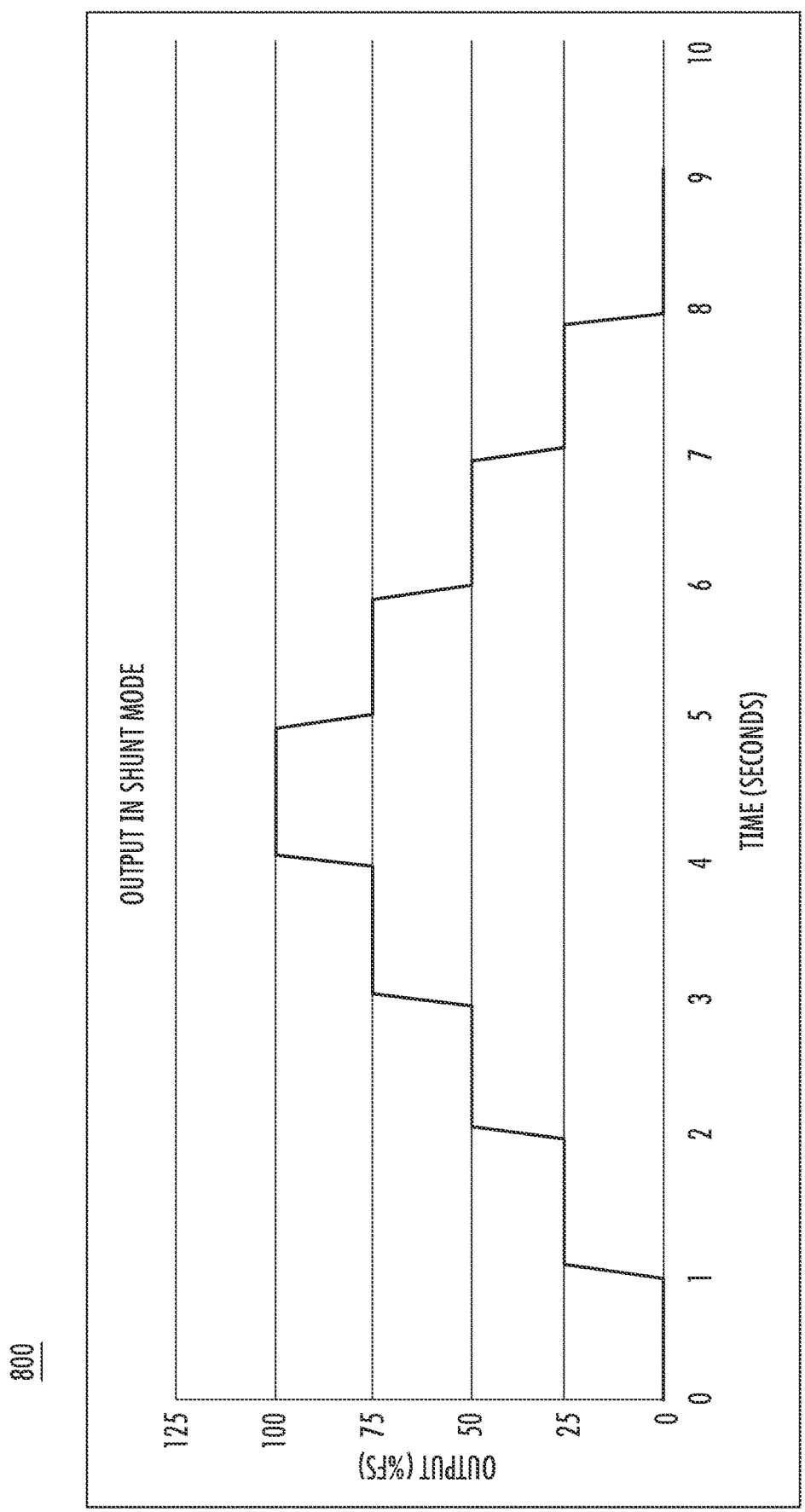

Having thus described the disclosure in general terms, reference will now be made to the accompanying drawings, which are not necessarily drawn to scale, and wherein:

FIG. 1 illustrates a schematic block diagram of example circuitry for a system in accordance with example embodiments of the present disclosure;

FIG. 2 illustrates a block diagram showing an example multi-point shunt calibration apparatus in accordance with example embodiments of the present disclosure;

FIG. 3 illustrates a block diagram showing data flow between components of an example multi-point shunt calibration apparatus in accordance with example embodiments of the present disclosure;

FIG. 4 illustrates a block diagram showing data flow between components of another example multi-point shunt calibration apparatus in accordance with example embodiments of the present disclosure;

FIG. 5 illustrates a circuit diagram showing an example shunt initialization circuit in accordance with example embodiments of the present disclosure;

FIG. 6 illustrates a circuit diagram showing an example multi-point shunt calibration circuit arrangement in accordance with example embodiments of the present disclosure;

FIG. 7 illustrates a flowchart describing example operations for multi-point shunt calibration of a sensor device in accordance with some example embodiments of the present disclosure;

FIG. 8 illustrates a flowchart describing example operations for multi-point shunt calibration of a sensor device, specifically for holding the output of a simulated calibration output, in accordance with some example embodiments of the present disclosure; and FIG. 9 illustrates a simulated calibration output diagram in accordance with some example embodiments of the present disclosure.

DETAILED DESCRIPTION

Embodiments of the present disclosure will now be described more fully hereinafter with reference to the accompanying drawings, in which some, but not all, embodiments of the present disclosure are shown. Indeed, embodiments of the present disclosure may be embodied in many different forms, and should not be construed as limited to the embodiments set forth herein; rather, these embodiments are provided so that the disclosure will satisfy applicable legal requirements. Like numbers refer to like elements throughout.

Definitions

The term "sensor device" refers to an electrical configuration arranged to measure a sensed value associated with a sensor environment, and output the measured sensed value via a sensor reading value. Examples of sensed values include pressure, torque, motion, and/or force, as well as other sensed physical values. In some embodiments, a sensor device is associated with one or more adjustable sensor parameters that can be calibrated to adjust a sensor reading value. In some embodiments, an example sensor device includes at least a measuring bridge circuit and a shunt calibration circuit.

In some embodiments, a sensor device is associated with at least a "measuring mode" (or "operation mode") and a "calibration mode." In measuring mode, a sensor device may detect a sensed value and, based on the sense value, output a corresponding actual reading value. The actual reading value may be adjusted based on one or more parameter values for one or more adjustable sensor parameters.

In calibration mode, a sensor device may receive a simulated calibration output and, based on the simulated calibration output, output a corresponding actual reading value. In calibration mode, a sensor lookup table may be corrected, for example by generating a calibrated lookup table to reflect calibrated reading values that are each associated with a corresponding simulated calibration output. Alternatively or additionally, in calibration mode, one or more parameter values for one or more adjustable sensor parameters may be set, for example by utilizing a calibration component. In some embodiments, the actual reading value output may be adjusted based on one or more parameter values for one or more adjustable sensor parameters. It should be appreciated that, in some embodiments, the sensed value detected by a sensor device may be ignored while in calibration mode.

The term "reading value" refers to an output associated with a sensor device, where the output is based on, e.g., (1) a sensed value or (2) a simulated calibration output provided as input to the sensor device. The term "actual reading value" refers to an output provided by the sensor device based on, e.g., (1) a sensed value or (2) a simulated calibration output provided as input to the sensor device. In some embodiments, an actual reading value may be output to a sensor display associated with the sensor device. The term "expected reading value" refers to a known and/or calculated value that a sensor device is expected to produce or display in response to a simulated calibration output having a particular value. For example, in some embodiments, a sensor device may include a non-transitory memory configured for storing expected reading values associated with various simulated calibration outputs. In some embodiments, one or more expected reading value(s) is/are utilized to calibrate the sensor device to be within a calibration accuracy range. The term "calibrated reading value" refers to an output provided by the sensor device while in measuring mode that is adjusted based on one or more calibrated sensor parameter values set for one or more calibration sensor parameters. In some embodiments, a calibrated reading value may be adjusted from an actual reading value based on one or more formulas that utilize the calibrated sensor parameter values.

The term "output driver" refers to an electrical component, circuitry, hardware, software, or a combination thereof for transmitting a simulated calibration output to a sensor device to cause the sensor device to output an actual reading value based on the simulated calibration output. An output driver receives an electrical signal from another component, and produces a corresponding simulated calibration output. For example, in some embodiments, a digital-to-analog converter outputs a converted calibration signal to an output driver as input. In other embodiments, a filter component outputs a filtered calibration signal to an output driver as input. In some embodiments, the output driver may be component of a calibration component.

In some embodiments, an output driver may be a voltage output driver. For example, in some embodiments, an output driver configured to produce signals outputted at 0-5 volts, 0-10 volts, or ±10 volts. Alternatively or additionally, an output driver may be a current output driver. For example, in some embodiments, an output driver configured to produce signals outputted at 4-20 mA.

The term "calibration command control" refers to an electrical component, circuitry, hardware, software, or a combination thereof, that outputs a command control status signal to a multi-point shunt calibration microcontroller. The command control status signal output by a calibration command control represents an input value utilized to control the value output by the multi-point shunt calibration microcontroller.

The term "calibration accuracy threshold" refers to a numerical value of a maximum differential between an actual reading value and an expected reading value for a sensor device to be considered accurately calibrated. In some embodiments, a sensor device may return to measuring mode after one or more adjustable sensor parameters are set to corresponding calibrated sensor parameter values that cause one or more actual values associated with one or more expected reading values to be within a calibration accuracy threshold.

The term "measuring bridge circuit" refers to a multi-branch electrical circuit for measuring a sensed value based on an analog sensor input. An example of a measuring bridge circuit includes a Wheatstone bridge. A measuring bridge circuit is associated with a "shunt calibration circuit", which refers to electrical circuitry for enabling shunt calibration of the sensor device including the measuring bridge circuit. For example, an example shunt calibration circuit includes one or more shunt resistors in parallel with one or more resistors of the measuring bridge circuit, where the shunt calibration resistors are associated with at least one shunt calibration switch for enabling shunt calibration via the shunt resistors.

The term "calibration component" refers to a device, circuitry, module, software, or combination thereof, configured to output or cause output of one or more simulated calibration outputs to a sensor device for performing shunt calibration of the sensor device. In some embodiments, the calibration component may be connected to the sensor device. In some embodiments, the calibration component may be a sub-component of the sensor device. In some embodiments, each simulated calibration outputs may be associated with an expected reading value for the sensor device. In some embodiments, a calibration component is configured to determine a calibrated sensor parameter value for one or more adjustable sensor parameters and/or set the calibrated sensor parameter value for one or more adjustable sensor parameters. In some embodiments, a calibration component may include one or more sub-components for performing the various operations described.

The term "calibration mode management component" refers to a device, circuitry, module, software, or a combination thereof, communicable with a sensor device and configured to initialize calibration and/or deinitialize calibration by setting a calibration mode associated with the sensor device. In some embodiments, a calibration mode management component is a sub-component of a calibration component. A calibration mode management component may output a "calibration initialization signal" in response to activation of the calibration mode management component to set the sensor device into a calibration mode. A calibration mode management component may output a "calibration deinitialization signal" in response to deactivation of the calibration mode management component to set the sensor device into an operating/measuring mode. Non-limiting examples of a calibration mode management component include a digital switch, an analog switch, a mode toggle button, or the like. In some embodiments, a calibration mode management component may be configured, for example by computer-coded instructions, to automatically activate calibration mode (for example, by transmitting a calibration initialization signal) in response to detecting one or more predefined parameters or circumstances (for example, may determine particular time of day/date, may detect sense value or actual reading value within a calibration activation range, and the like). In some embodiments, a calibration mode management component is embodied by a calibration switch or a calibration command control. In some embodiments, a calibration mode management component is embodied by a multi-point shunt calibration microcontroller, or a multi-point shunt calibration controller in conjunction with a calibration switch or a calibration command control.

The term "calibration controller component" refers to a device, circuitry, module, software, or a combination thereof, configured to generate, determine a value for, or otherwise manage outputting of a plurality of simulated calibration outputs. In some embodiments, the calibration controller component may be configured to manage outputting of various simulated calibration outputs associated with a predefined output sequence and/or one or more automatic output time shift intervals. The calibration controller component may include one or more subcomponents thereof to transmit a simulated calibration output to the sensor device to cause the sensor device to output a corresponding reading value. In some embodiments, the calibration controller component may include at least a multi-point shunt calibration circuit associated with a sensor device. In other embodiments, the calibration controller component may include at least a multi-point shunt calibration microcontroller associated with a sensor device. In some embodiments, a calibration controller component may include a filter component or a digital-to-analog converter, and an output driver.

The term "simulated calibration output" refers to an artificially controlled electronic signal having a known value that is outputted from a calibration component, or a subcomponent thereof, to a sensor device while the sensor device is in calibration mode. In some embodiments, a simulated calibration output may be associated with an actual reading value for a sensor device, such that the simulated calibration output causes the sensor device to output, and/or render to a display, the actual reading value. In some embodiments, the simulated calibration output may be associated with an expected reading value for a sensor device based on the known value of the simulated calibration output. Non-limiting examples of a simulated calibration output include a voltage, current, and/or other physical value as a percentage of full scale associated with the sensor device or as an absolute value.

The term "representative calibration value" refers to an electrical signal output by a multi-point shunt calibration microcontroller, which corresponds to a particular simulated calibration output. A representative calibration value may be based on a command control status signal or a switch status signal received as input to the multi-point shunt calibration microcontroller during calibration mode. In some embodiments, a calibration component (and/or a sub-component thereof) may include another electrical component configured to interpret the representative calibration value, for example an RC filter or a digital-to-analog converter. Examples of representative calibration values include an "interpretable calibration value" and a "pulse width modulated calibration value".

The term "interpretable calibration value" refers to a digital signal outputted by a multi-point shunt calibration microcontroller, where the digital signal represents a digital value using a binary representation. An interpretable calibration value has a known bit-length (for example, 12-bits, 16-bits, 24-bits, or the like). In some embodiments, an interpretable calibration value is outputted as serial data. In other embodiments, an interpretable calibration value is outputted as parallel data. An interpretable calibration value may be interpreted using a known protocol, including but not limited to SPI, I2C, UART, and the like. In some embodiments, an interpretable calibration value is outputted to a digital-to-analog converter, which may receive the interpretable calibration value and output a corresponding converted calibration signal.

The term "converted calibration signal" refers to an electrical signal output by a digital-to-analog converter transmitted to an output driver. In some embodiments, the converted calibration signal is a voltage.

The term "pulse width modulated calibration value" refers to an electrical signal output by a multi-point shunt calibration microcontroller, where the electrical signal represents a value utilizing a fixed-frequency pulse train with pulses of varying width interpretable using a filter component (for example, a RC filter). A filter component may receive a pulse width modulated calibration value and output a corresponding filtered calibration signal.

The term "filtered calibration signal" refers to an output of a filter component transmitted to an output driver. In some embodiments, a filter calibration signal may represent a voltage.

The term "predefined output sequence" refers to a particular order of simulated calibration outputs outputted while in calibration mode, such that subsequent simulated calibration outputs in the predefined output sequence are associated with different values. In some embodiments, a predefined output sequence may include increasing simulated calibration outputs between a lower boundary simulated calibration output and an upper boundary simulated calibration output. In other embodiments, a predefined output sequence may include decreasing simulated calibration outputs between an upper boundary simulated calibration output and a lower boundary simulated calibration output. In other embodiments, a predefined output sequence includes a cycle of simulated calibration outputs, such that the simulated calibration outputs in a defined sequence begin and end at the same simulated calibration output. In some embodiments, a predefined output sequence may be repeated one, two, three, or more times (up to N times).

The term "automatic output shift time interval" refers to a length of time that for which a simulated calibration output is output before automatically changing to a different simulated calibration output in a predefined output sequence. An example calibration component may track an "output time" that a particular simulated calibration output has been outputted for, and change to a different simulated calibration output when the output time satisfies the automatic output shift time interval (e.g., when the output time exceeds the automatic output shift time interval, meaning sufficient time elapsed). In an example embodiment, a calibration component may change a presently outputted simulated calibration output by an automatic output step after the output time for the presently outputted simulated calibration output satisfies automatic output shift time interval.

It should be appreciated that calibration components described herein may be capable of outputting a plurality of simulated calibration outputs at different values. For example, an example calibration component may be configured to output at least three simulated calibration outputs: an upper boundary simulated calibration output, a lower boundary simulated calibration output, and an intermediate simulated calibration output, each having a different value. In other embodiments, a calibration component may output a boundary simulated calibration output (e.g., an upper boundary simulated calibration output and a lower boundary simulated calibration output) and output any number of intermediate simulated calibration outputs between the lower and upper boundary simulated calibration outputs. The term "initial calibration output" refers to the first simulated calibration output upon initialization of calibration mode. In some embodiments, the initial calibration output may be a predefined simulated calibration output having a specific value. In some embodiments, an initial calibration output may be a lower boundary simulated calibration output, an upper boundary simulated calibration output, or an intermediate simulated calibration output. For example, in some embodiments, the initial calibration output is predefined as 0 percent of full scale.

In some embodiments, simulated calibration outputs are outputted according to a predefined output sequence, where each simulated calibration output in the predefined output sequence is the output for an automatic output shift time interval (where the automatic output shift time interval may be different for each simulated calibration output, shared between some simulated calibration outputs, or the same for each simulated calibration output). An example calibration component may output, or otherwise provide, an initial simulated calibration output at any value between the lower and upper boundary simulated calibration outputs, or may be the lower boundary simulated calibration output or upper boundary simulated calibration output. The calibration component may then continue outputting subsequent simulated calibration outputs according to a predefined output sequence. For example, some calibration components output, or otherwise provide, an initial simulated calibration output, such as a lower boundary simulated calibration output, and step up to provide various intermediate simulated calibration outputs until the upper boundary simulated calibration output is reached. In some embodiments, the sequence ends upon reaching the upper boundary simulated calibration output. In other embodiments, the sequence continues to then step down until the lower boundary simulated calibration output is reached. In some embodiments, the sequence ends upon reaching the lower boundary simulated calibration output. In other embodiments, an initial simulated calibration output is outputted, such as an upper boundary simulated calibration output, then the sequence may step down until the lower boundary simulated calibration output is reached. In some embodiments, the sequence may end upon reaching the lower boundary simulated calibration output. In other embodiments, the sequence may continue to step up until the upper boundary simulated calibration output is reached. In some embodiments, the sequence may end upon reaching the upper boundary simulated calibration output. In other embodiments, a predefined output sequence may continue for any number of times (e.g., the predefined output sequence may define a cycle that can be repeatedly outputted by a calibration component, or a subcomponent thereof). In some embodiments, the initial simulated calibration output may equal either the lower boundary simulated calibration output or the upper boundary simulated calibration output.

The term "hold input" refers to one or more electrical components configured to cause continued output of a presently outputted simulated calibration output. For example, the presently outputted simulated calibration output may continue to be outputted for (1) a period of time, (2) a predetermined duration, (3) as requested by an operator, or a combination thereof. In some embodiments, the hold input may be activated to enable continued output of a simulated calibration output. In some embodiments, activation of a hold input may transmit a hold initialization signal. In some embodiments, a hold input may be deactivated to enable output of a next simulated calibration output in a predefined output sequence. In some embodiments, deactivation of a hold input may transmit a hold cancellation signal. In some embodiments, a presently outputted simulated calibration output may be output from the time a hold initialization signal is received until a hold cancellation signal is received. Non-limiting examples of a hold input include an analog hold switch and a digital hold switch.

The term "hold initialization signal" refers to a signal transmitted by a hold input to cause the calibration component to continue to output a presently outputted simulated calibration output currently being output. For example, the calibration component may continue to output a presently outputted simulated calibration output currently being output for (1) a period of time, (2) a predetermined duration, (3) as needed by an operator, or combinations thereof. In some embodiments, the hold initialization signal may be an analog signal transmitted by an analog hold switch. In other embodiments, the hold initialization signal may be a digital signal transmitted by a digital hold switch.

The term "hold cancellation signal" refers to a signal transmitted by a hold input to cause the calibration component to stop outputting the presently outputted simulated calibration output and return to a predefined output sequence. In some embodiments, the hold cancellation signal may be an analog signal transmitted by an analog hold switch. In other embodiments, the hold cancellation signal may be a digital signal transmitted by a digital hold switch.

The term "adjustable sensor parameter" refers to a factor associated with a sensor device, which can be changed during calibration mode to affect a sensed value that is output by a sensor device in measuring mode. An adjustable sensor parameter is associated with a "parameter value" that represents the numerical value of the adjustable sensor parameter at a given time. In some embodiments, a parameter value for an adjustable sensor parameter may be set in a digital manner, for example by storing the parameter value for the adjustable sensor parameter in a non-volatile memory associated with the sensor device such that the parameter value may be retrieved and utilized by the sensor in measuring mode. In other embodiments, a parameter value for an adjustable sensor parameter may be set in an analog manner, for example by altering one or more components of a calibration circuit (e.g., modifying one or more resistances). Non-limiting examples of adjustable sensor parameters include gain, balance, and/or zero.

The term "sensor adjustment component" refers to a physical device, component, circuitry, module, software, or a combination thereof, for setting a parameter value for an adjustable sensor parameter associated with a sensor device. In some embodiments, a sensor adjustment component may be embodied by devices, hardware, circuitry, software, or a combination thereof for determining a parameter value for at least one adjustable sensor parameter, and/or setting a parameter value for the at least one adjustable sensor parameter. For example, in some embodiments, a sensor adjustment component may include a processor associated with a memory having computer-coded instructions therein for performing the operations described herein. In some embodiments, a sensor adjustment component may include one or more adjustment knobs, wheels, or other devices for setting a physical position associated with a corresponding parameter value for an adjustable sensor parameter, in response to user engagement by an operator.

The term "calibrated sensor parameter value" refers to a particular parameter value for an adjustable sensor parameter to achieve, for a given sensed value, simulated calibration output, percentage of full scale, or the like, an actual reading value for a sensor device that is calibrated to be within a calibration accuracy range. A calibrated sensor parameter value is set by, or utilizing, a sensor adjustment component. In some embodiments, a calibrated sensor parameter value may be calculated and/or determined automatically, for example by a device, hardware, circuitry, software, or a combination thereof. In other embodiments, a calibrated sensor parameter value is received via a sensor adjustment component configured for user engagement.

Overview

Calibrating a sensor device may allow for improved accuracy of the sensor device while in a measuring mode. A sensor device that is uncalibrated, poorly calibrated, or inaccurately calibrated may be more likely to output an inaccurate reading value for one or more sensed values. Various sensor devices, such as analog pressure, load, and torque sensors, may be configured using hardware and/or software to implement shunt calibration. Shunt calibration may improve the accuracy of a sensor device by causing the sensor device to output a reading value based on a simulated calibration output. The simulated calibration output may, for example, be a certain percentage of full scale or span, such that the simulated calibration output is associated with a known, expected reading value for the sensor device.

In some embodiments, each simulated calibration output is associated with an actual reading value for the sensor device and an expected reading value for the sensor device. When the sensor device is not calibrated, the actual reading value and the expected reading value may differ, such that the difference exceeds a desired calibration accuracy threshold. The expected reading value and the actual reading value associated with the simulated calibration output may differ due to errors introduced in the signal chain between the sensor device and an end user system (for example, a database or a user interface for displaying the actual reading value). Such errors include non-linearity, hysteresis, zero, dead band, and gain errors associated with the signal chain or data acquisition chain. Uncalibrated sensor devices, and sensor devices calibrated utilizing traditional shunt calibration, may insufficiently address such errors.

Using multi-point shunt calibration, as described herein, the sensor device may be calibrated based on multiple simulated calibration outputs, including one or more intermediate simulated calibration outputs, where each simulated calibration output is associated with an actual reading value and an expected reading value. Based on the multiple actual reading values and/or multiple expected reading values associated with the various simulated calibration outputs issues that arise with respect to accurately producing, displaying, or otherwise outputting an actual reading value from a sensor device based on a sensed value, for example errors introduced via the signal and/or data acquisition chain such as non-linearity, dead zone, hysteresis, zero, and gain errors associated with the sensor device may be detected and accounted for. Based on the multiple actual reading values and/or multiple expected reading values associated with the various simulated calibration outputs, the sensor device may be calibrated to accurately address detected errors. For example, rather than calibrating the sensor device based on a single simulated calibration output and a corresponding actual reading value and/or a corresponding expected reading value for the sensor device, or based on two simulated calibration outputs (e.g., 0% and some percentage of full scale) and two corresponding actual reading values and/or two corresponding expected reading values, the sensor device, utilizing the disclosed multi-point shunt calibration methods, may calibrate the sensor over an operating range (e.g., a full operating scale associated with the sensor device) to detect and account for errors that may arise when the sensor device is operating within the operating range. Utilizing multi-point shunt calibration, the sensor device may provide a calibrated reading value that takes into account errors found in the signal chain throughout the operating range of the sensor device. The calibrated reading value may thereby provide a more accurate reading of the sensed condition.

In some embodiments, one or more calibrated sensor parameter values may be set for one or more adjustable sensor parameters, for example for adjusting actual reading values in measuring mode based on the calibrated sensor values for the full scale of the sensor device. Setting the calibrated sensor values based on the first, second, and third actual reading values may enable improved adjustment of actual reading values to account for non-linear issues, for example using a predefined formula or calibrated lookup table to adjust a calibrated reading value produced by a sensor device across the full scale for the sensor device. Any number of intermediate simulated calibration outputs may be utilized to calibrate the sensor device to produce calibrated reading values within a desired accuracy level.

Multi-point shunt calibration may also be utilized to identify issues associated with a sensor device or subcomponents thereof. For example, multi-point shunt calibration may be utilized to identify problems associated with hysteresis, non-linearity, or other issues based on the physical construction and/or state of components of the sensor device. Multi-point shunt calibration may enable identifying that such issues affect the accuracy of the sensor device sufficiently such that the sensor device is not within a desired accuracy, and thus the sensor requires new components and/or component maintenance to improve accuracy.

In some embodiments, an appropriate simulated calibration output is outputted in a predefined output sequence based on a predefined output sequence. In some embodiments, each simulated calibration output may be outputted (or in other words be produced as the output) for the length of time defined by the automatic output time shift interval, after which a different simulated calibration output may be outputted. For example, where the multiple calibration outputs are associated with a predefined output sequence, each simulated calibration output may be associated with another simulated calibration output that follows next in the predefined output sequence. The differences between the multiple simulated calibration outputs may be associated with an output step size, such that each simulated calibration output differs from the next simulated calibration output in the predefined output sequence by the output step size, where the output step size is the same or different between each adjacent simulated calibration output. Some embodiments include a multi-point shunt calibration microcontroller configured to output an appropriate simulated calibration output of a plurality of possible simulated calibration outputs using time division multiplexing (e.g., for example, with an automatic output shift time interval of 1 second, 5 seconds, 10 seconds, and the like).

In some embodiments, the output step size between simulated calibration outputs associated with a predefined output sequence may be equal between all simulated calibration outputs (e.g., a first intermediate simulated calibration output is 1 step size away from a second intermediate simulated calibration output, 2 step sizes away from a third intermediate simulated calibration output, 3 step sizes away from a fourth intermediated calibration output, and so on). In other embodiments, the output step size between simulated calibration outputs may be non-uniform, such that the step size between some simulated calibration outputs is larger than the step size between some other simulated calibration outputs. For example, in one example embodiment, the step size between a first intermediate simulated calibration output and a second intermediate simulated calibration output may be lower than the step size between the second intermediate simulated calibration output and a third intermediate simulated calibration output. It should be appreciated that the step size between an intermediate simulated calibration output and a boundary simulated calibration output may be different from the step sizes between intermediate simulated calibration outputs. In some embodiments, for example, the output step size may increase by a set value, or by a percentage value, each step up (or each step down) in a predefined output sequence. In other embodiments, a predefined output sequence may be associated with a step size set, which defines the one or more output step sizes between the various simulated calibration outputs associated with the predefined output sequence. The output step sizes in the step size set may be non-uniform or uniform.

Similarly, in some embodiments, the automatic time shift interval associated with each simulated calibration output associated with a predefined output sequence may be equal for each simulated calibration output in the predefined output sequence. For example, in some embodiments, each simulated calibration output may be outputted for the same automatic output time shift interval (e.g., 1 second, 2 seconds, 5 seconds, 10 seconds, or the like). In other embodiments, the automatic output time shift interval for each simulated calibration output may be different for certain, or each, simulated calibration output in a predefined output sequence. In some embodiments, the automatic output calibration time shift interval may increase (or decrease) by a set value for each simulated calibration output in the predefined output sequence. In other embodiments, a predefined output sequence may be associated with an output shift interval set including an automatic output time shift interval associated with each simulated calibration output in the predefined output sequence. In an example embodiment, an example predefined output sequence may be associated with an output shift interval set such that a lower boundary simulated calibration output is outputted for a first automatic output time shift interval (e.g., 1 second), a first intermediate simulated calibration output is outputted for a second automatic output time shift interval (e.g., 2 seconds), a third intermediate simulated calibration output is outputted for a third automatic output time shift interval (e.g., 5 seconds) and so on. In some embodiments, one or more of the automatic output time shift intervals in the output shift interval set may be equal.

In other embodiments, the value associated with simulated calibration outputs may be controlled manually by a user. For example, some embodiments include a single shunt initialization component for setting one or more calibration value inputs, where the shunt initialization component may be set to various levels, each level associated with a different simulated calibration output (e.g., a first level for setting a first calibration value input associated with a simulated calibration output of −10 volts, a second level for setting a first and a second calibration value inputs associated with a simulated calibration output of −5 volts, a third level for setting a first, a second, and a third calibration value inputs associated with a simulated calibration output of 0 volts, and so on). Alternatively, in some embodiments, a shunt initialization component may include various calibration value switches for setting the various calibration value inputs.

A sensor device is associated with one or more adjustable sensor parameters that may be adjusted to calibrate the sensor device. For example, adjustable sensor parameters for a particular sensor device may include span, balance, zero, and/or the like. Each adjustable sensor parameter may be set to a sensor parameter value, which affects the actual reading value output by the sensor device for various inputs.

Embodiments of the present disclosure thus provide many advantages. Embodiments enable accurate calibration of sensor devices using multi-point shunt calibration. Additionally, specific embodiments enable a user and/or calibration system to detect and/or address non-linearity, hysteresis, dead band, zero, and gain errors associated with the signal chain and/or data acquisition chain. Embodiments thus enable shunt calibration with increased accuracy that accounts for such errors.

Examples of Multi-Point Shunt Calibration Apparatuses

The methods, apparatuses, systems, and computer program products of the present disclosure may be embodied by any variety of devices. For example, a method, apparatus, system, and computer program product of an example embodiment may be embodied by a multi-point shunt apparatus including a calibration component associated with a sensor device and a sensor adjustment component. Example embodiments may include a combination of analog and digital circuitry.

FIG. 1 shows a schematic block diagram of circuitry 10, which may be included in, for example, a sensor device, a calibration component (or device), and/or the like, or a combination thereof. A sensor device, calibration component, may include one or more components of the circuitry 10, and may be configured to, either independently or jointly, and/or with other devices via a network, perform the functions described herein. As illustrated in FIG. 1, in accordance with some example embodiments, circuitry 10 can include various means, such as processor 12, memory 14, communications module 16, I/O module 18, multi-point shunt calibration system 22, and/or multi-point shunt calibration database 24. As referred to herein, "block", "module", and "circuitry" includes hardware, software, and/or firmware configured to perform one or more particular functions. In this regard, the means of circuitry 10 as described herein may be embodied as, for example, circuitry, hardware elements (e.g., one or more suitably programmed processor, microprocessor, combinational logic circuit, and/or the like), a computer program product comprising computer-readable program instructions stored no a non-transitory computer-readable medium (e.g., memory 14) that is executable by a suitably configured processing device (e.g., processor 12), or some combination thereof.

Processor 12 may, for example, be embodied as various means including one or more microprocessor with accompanying digital processor(s), one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits such as, for example, an ASIC (application specific integrated circuit) or FPGA (field programmable gate array), or some combination thereof. Accordingly, although illustrated in FIG. 1 as a single processor, in some embodiments processor 12 comprises a plurality of processors. The plurality of processors may be embodied on a sensor, calibration component, server, or may be distributed across a plurality of devices collectively configured to function as circuitry 10. The plurality of processors may be in operative communication with each other and may be collectively configured to perform one or more functionalities of circuitry 10 as described herein. In an example embodiment, processor 12 is configured to execute instructions stored in memory 14, or otherwise accessible to the processor 12. These instructions, when executed by processor 12, may cause circuitry 10 to perform one or more of the functionalities of circuitry 10 as described herein.

Whether configured by hardware, firmware/software methods, or by a combination thereof, processor 12 may comprise an entity capable of performing operations according to embodiments of the present disclosure when configured accordingly. Thus, for example, when processor 12 is embodied as an ASIC, FPGA, or the like, processor 12 may comprise specifically configured hardware for conducting one or more operations described herein. Alternatively, as another example, when processor 12 is embodied as an executor of instructions, such as may be stored in the memory 14, the instructions may specifically configure processor 12 to perform one or more formula and operations described herein, such as those discussed in connection with FIGS. 7 and 8.

Memory 14 may comprise, for example, volatile memory, non-volatile memory, or some combination thereof. Although illustrated in FIG. 1 as a single memory, memory 14 may comprise a plurality of memory components. The plurality of memory components may be embodied on a single sensor device, calibration component, server, and/or a combination thereof, or a distributed across a plurality of such devices. In various embodiments, memory 14 may comprise, for example, a hard disk, random access memory, cache memory, flash memory, a compact disc read only memory (CD-ROM), digital versatile disc read only memory (DVD-ROM), an optical disc, circuitry configured to store information, or some combination thereof. Memory 14 may be configured to store information, data (including data discussed with regards to the multi-point shunt calibration database 24), applications, instructions, or the like for enabling circuitry 10 to carry out various functions in accordance with example embodiments of the present disclosure. For example, in at least some embodiments, memory 14 is configured to store a parameter value for one or more adjustable sensor parameters. Additionally or alternatively, in at least some embodiments, memory 14 is configured to store program instructions for execution by processor 12. Memory 14 may store information in the form of static and/or dynamic information. This stored information may be stored and/or used by circuitry 10 during the course of performing its functionalities.

Communications module 16 may be embodied as any device or means embodied in circuitry, hardware, a computer program product comprising computer readable program instructions stored on a computer readable medium (e.g., memory 14) and executed by a processing device (e.g., processor 12), or a combination thereof that is configured to receive and/or transmit data from/to another device and/or network, such as, for example, a sensor device, calibration component, sensor adjustment component, or other device/component associated with circuitry 10, and/or the like. In some embodiments, communications module 16 (like other components discussed herein) can be at least partially embodied as or otherwise controlled by processor 12. In this regard, communications module 16 may be in communication with processor 12, such as via a bus. Communications module 16 may include, for example, an antenna, a transmitter, a receiver, a transceiver, network interface card and/or supporting hardware and/or firmware/software for enabling communications with another device of circuitry 10. Communications module 16 may be configured to receive and/or transmit any data that may be stored by memory 14 using any protocol that may be used for communications between devices and/or components, such as a sensor device, calibration component, server, and the like. Communications module 16 may additionally or alternatively be in communication with the memory 14, I/O module 18 and/or any other component of circuitry 10, such as via a bus.

Circuitry 10 may include input/output (I/O) module 18 in some embodiments. I/O module 18 may be in communication with processor 12 to receive an indication of a user input and/or to provide an audible, visual, mechanical, or other output to a user. As such, I/O module 18 may include support, for example, for a keyboard, digital inputs, analog inputs, a mouse, a joystick, a sensor display, a calibration component display, a touch screen display, a microphone, a speaker, a RFID reader, barcode reader, biometric scanner, and/or other input/output mechanisms. In embodiments wherein circuitry 10 is embodied as at least a server or database, aspects of I/O module 18 may be reduced as compared to embodiments where circuitry 10 is implemented as an end-user machine or other type of device designed for complex user interactions (e.g., a sensor device and/or calibration component). In some embodiments (like other components discussed herein), I/O module 18 may even be eliminated from circuitry 10. Alternatively, such as in embodiments wherein circuitry 10 is embodied as a server or database, at least some aspects of input/output module 18 may be embodied on an apparatus used by a user that is in communication with circuitry 10. I/O module 18 may be in communication with the memory 14, communications module 16, and/or any other component(s), such as via a bus. One or more than one I/O module and/or other component can be included in circuitry 10.

Circuitry 10 may include multi-point shunt calibration system 22 in some embodiments. Multi-point shunt calibration system 22 may be in communication with processor 12 and/or one or more other modules, to output one or more simulated calibration outputs to a sensor device, and/or cause displaying of an actual reading value associated with the simulated calibration output to a display of the sensor device. The multi-point shunt calibration system 22 may, utilizing one or more of the I/O module 18, processor 12, or the like, detect and/or store an actual reading value associated with a simulated calibration output being outputted. Additionally or alternatively, the multi-point shunt calibration system 22 may determine a calibrated sensor parameter value for one or more adjustable sensor parameters, for example based on an actual reading value and an expected reading value for various simulated calibration outputs. In this way, the multi-point shunt calibration system 22 may support multiple formulas, algorithms, or the like for determining a calibrated reading value, the calibrated sensor parameter value for one or more adjustable sensor parameters, and/or communicate with processor 12 and/or memory 14 to execute instructions for performing the formula(s). The multi-point shunt calibration system 22 may set the calibrated sensor parameter value for one or more adjustable sensor parameters, for example by communicating with the multi-point shunt calibration database 24 and/or memory 14.

Circuitry 10 may also include multi-point shunt calibration database 24. In some embodiments, the multi-point shunt calibration database 24 may be provided that includes parameter values for one or more adjustable sensor parameters for a sensor device. The multi-point shunt calibration database 24 may be accessed, for example utilizing processor 12, to retrieve the parameter values for the one or more adjustable sensor parameters to adjust an actual reading value based on the one or more parameter values to produce a calibrated reading value. The multi-point shunt calibration system 22 may communicate with the multi-point shunt calibration database 24 to store calibrated sensor parameter values for the adjustable sensor parameters during multi-point shunt calibration. In some embodiments, the multi-point shunt calibration database 24 may generate and/or store a lookup table for determining calibrated sensor values based on sensed values.

Circuitry 10 may be embodied by one or more devices and/or components forming a sensor device, calibration component, and/or multi-point shunt calibration apparatus, such as the apparatus 100 illustrated in FIG. 2. As illustrated in FIG. 2, the apparatus 100 may include a sensor device 102, calibration component 108, and a sensor adjustment component 114. It should be appreciated that each of the sensor device 102, calibration component 108, and sensor adjustment component 114 may be embodied using a myriad of subcomponents, as will be described further below. The apparatus 100 may be configured to perform the operations described using one or more of the components 102, 108, and 114, and/or one or more of the subcomponents therein.

The sensor device 102 includes circuitry, components, modules, and/or a combination thereof, for measuring a sensed value based on a sensor input associated with a sensor environment, and to output a reading value associated with the sensed value. The sensor device 102 may measure the sensed value based on the sensor input while in a measuring (or operating) mode. In some embodiments, a sensor device includes a measuring bridge component 104 configured for converting an analog sensor input into a sensed value associated with an actual reading value. For example, the measuring bridge component 104 may receive an analog sensor input from an electrical transducer (not shown), and convert the sensor input into a corresponding sensed value that represents the analog sensor input.

The sensed value output by the measuring bridge component 104 may be adjusted based on one or more adjustable sensor parameters to account for errors, such as those introduced in the signal chain and/or data acquisition chain. In some embodiments, the adjustable sensor parameters alter the physical properties associated with circuitry and/or subcomponents of the measuring bridge component 104. In other embodiments, the adjustable sensor parameters may be stored in a non-volatile memory associated with the sensor device 102, and/or associated with the sensor adjustment component 114.

The calibration component 108 includes circuitry and/or other hardware for initializing and/or performing calibration of the sensor device 102. The calibration component 108 may be configured to communicate with sensor device 102 and/or sensor adjustment component 114 to initialize and/or perform calibration of the sensor device 102.

For example, in an example embodiment, the calibration component 108 may include a calibration mode management component 110. The calibration mode management component 110 may include circuitry, hardware, and/or the like to toggle the sensor device 102 between a measuring mode and a calibration mode. For example, the calibration mode management component 110 may include a shunt calibration switch (e.g., an analog switch or digital switch), dial, or similar input component, for activating/deactivating the calibration mode.

In some embodiments, the user may activate a calibration mode management component 110, or a sub-component thereof, to cause transmission of the calibration initialization signal. In other embodiments, the calibration mode management component 110 may activate calibration mode automatically and automatically transmit a corresponding calibration initialization signal. For example, in some embodiments, the calibration mode management component 110 may detect, for example using one or more specially configured hardware and/or software, circuitry, and/or the like, that calibration mode should be initialized based on an actual reading value, a sensed value, and/or another factor. In yet other embodiments, a calibration mode management component 110 may transmit a calibration initialization signal automatically at determined and/or predetermined interval (e.g., once a day, once a month, once a year, after a predetermined number of readings, and the like).

The calibration mode management component 110 may receive a calibration initialization signal when calibration mode is activated via the calibration mode management component. The calibration initialization signal may include a digital initialization signal. For example, in some embodiments, the calibration initialization signal indicates that the sensor device should be set to calibration mode, and may be used to set one or more calibration value inputs associated with the simulated calibration output of the apparatus. For example, in some embodiments, the calibration initialization signal may be above a calibration threshold, and the value of the calibration initialization signal may control be determine one or more inputs to a multi-point shunt calibration circuit and/or multi-point shunt calibration microcontroller. The calibration initialization signal may include an analog initialization signal. For example, in some embodiments, the calibration initialization signal is a voltage associated with setting the sensor device 102 to calibration mode, and/or associated with setting one or more calibration value inputs associated with a corresponding multi-point shunt calibration circuit and, thus, determine the simulated calibration output.

The calibration mode management component may receive a calibration deinitialization signal when calibration mode is deactivated, for example via the calibration mode management component. The calibration deinitialization signal may include a digital deinitialization signal. For example, in some embodiments, the calibration deinitialization signal indicates that the sensor device should return to an operational/measuring mode. The calibration deinitialization signal may include an analog deinitialization signal. For example, in some embodiments, the calibration deinitialization signal is a voltage associated with deactivating calibration mode and setting the sensor device 102 to an operating/measuring mode.

The calibration mode management component 110 may include circuitry, hardware, or the like for activating the shunt calibration component 106 associated with the sensor device 102. The shunt calibration component 106 includes circuitry, hardware, software, or a combination thereof for activating shunt calibration mode for the sensor device 102. Additionally or alternatively, the shunt calibration component 106 includes circuitry, hardware, software, or a combination thereof for outputting an artificial, simulated calibration output to the sensor device 102. For example, shunt calibration component 106 may include hardware that, when the sensor device 102 is set to calibration mode, bypasses the input of the measuring bridge component 104 and instead utilizes a simulated calibration output as input. Thus, using the shunt calibration component 106, the sensor device 102 may output an actual reading value associated with a simulated calibration output rather than an actual reading value associated with a sensed value (for example, resulting from an actual force applied to a force sensor, a pressure applied to a pressure sensor, and the like).

The shunt calibration component 106 may include means, such as hardware, circuitry, software, or a combination thereof, for setting one or more calibrated sensor parameter values for one or more adjustable sensor parameters associated with the sensor device 102. In some embodiments, the shunt calibration component 106 may include or be associated with a non-transitory memory for storing the one or more calibrated sensor parameter values while in calibration mode. For example, the sensor device 102 may receive the at least one calibrated sensor parameter value from the calibration component 108 via shunt calibration component 106. When the sensor device 102 is in measuring mode, the shunt calibration component 106 may access the calibrated parameter values, for example by retrieving them from the non-volatile memory, for use in producing a calibrated reading value for the sensor device 102. For example, in some embodiments, an actual reading value associated with a sensed value (e.g., an actual reading value determined by the sensor device 102 utilizing the measuring bridge component 104) may be adjusted utilizing the calibrated sensor parameter value(s) for one or more adjustable sensor parameters to produce the calibrated reading value.

Calibration controller component 112 includes circuitry, hardware, or the like for determining and/or outputting various simulated calibration outputs to the sensor device 102 while in calibration mode. The calibration controller component 112 may transmit the simulated calibration output to the shunt calibration component 106 of the sensor device 102, causing the sensor device 102 to output an actual reading value based on the simulated calibration output from the calibration controller component 112.

The calibration controller component 112 is configured to output various simulated calibration outputs, each associated with a different expected reading value. For example, the calibration controller component is configured to output various simulated calibration outputs that represent different percentages of full scale associated with the sensor device 102. The calibration controller component may output at least one lower boundary simulated calibration output (e.g., representative of 0% of full scale), one upper boundary simulated calibration output (e.g., representative of 100% of full scale), and at least one intermediate simulated calibration output (e.g., representative of 50% of full scale). Accordingly, the calibration controller component is configured to facilitate multi-point shunt calibration as described further herein.

In some embodiments, the calibration controller component 112 is configured to provide, by outputting, a particular simulated calibration output for an automatic output shift time interval. After the automatic output shift time interval elapses, a second simulated calibration output may be outputted, where the second simulated calibration output is at a different value. The calibration controller component 112 may include timing circuitry and/or components for tracking an output time associated with the currently provided simulated calibration output.

In some embodiments, the calibration controller component 112 receives one or more calibration input values, such as control signals and/or analog signals that are set by one or more input controls, which are utilized to determine the simulated calibration output to be outputted to the sensor device 102. For example, the calibration controller component 112 may receive various input values based on a digital input provided by a user or determined by the calibration controller component 112 itself, or another module, indicating a desired simulated calibration output. Alternatively, the calibration controller component 112 may receive various input values based on an analog setting of a multi-value input component (such as a dial, for example) that corresponds to a desired calibration output.

The calibration controller component may include a multi-point shunt calibration microcontroller. The calibration controller component may include additional hardware, circuitry, or other components for initializing the multi-point shunt calibration microcontroller for shunt calibration and/or controlling the multi-point shunt calibration microcontroller (for example, a calibration command control or a calibration switch). Additionally or alternatively, the calibration controller component may include additional hardware, components, and/or circuitry for further processing the output of the multi-point shunt calibration microcontroller into a corresponding simulated calibration output. The multi-point shunt calibration microcontroller may be configured, using computer-coded instructions, to perform one or more operations described herein.

In some embodiments, the calibration controller component 112 includes a hold input for maintaining the particular simulated calibration output for a defined period of time, or until a further signal is received. For example, the hold input may be embodied by a hold analog switch, a hold digital switch, a hold toggle button, or similar hardware component. The hold input may be configured to transmit a hold initialization signal when activated. The hold input may be configured to transmit a hold deinitialization signal when deactivated.

The calibration controller component 112 may include a multi-point shunt calibration circuit specially configured for outputting a simulated calibration output based on one or more calibration input values. For example, in some embodiments, one or more digital or analog calibration input values is received from a component of circuitry 10, and a simulated calibration output is outputted from the multi-point shunt calibration circuit based on a circuit resistance for the multi-point shunt calibration circuit. The circuit resistance may change based on the one or more calibration input values, for example where each calibration input value is associated with an output adjustment switch for connecting one or more resistors in parallel, thus adjusting the overall circuit resistance. In some embodiments, an output adjustment switch is a hardware component that, based on a corresponding calibration input value, alters a physical property of a multi-point shunt calibration circuit to alter the simulated calibration output that is outputted by the multi-point shunt calibration circuit. For example, a first output adjustment switch may be associated with a first calibration input value, such that when the first calibration input value is active (e.g., above a predefined threshold), the first output adjustment switch is toggled to include a first resistor in a multi-point shunt calibration circuit. It should be appreciated that, in other embodiments, alternative components may be used to alter physical properties of the multi-point shunt calibration circuit (e.g., voltage, current, resistance, and the like).

Sensor adjustment component 114 includes hardware, circuitry, or the like for determining, and/or setting and maintaining one or more adjustable sensor parameters for the sensor device 102. The sensor adjustment component 114 includes adjustment determination component 116. In some embodiments, the adjustment determination component generates, calculates, and/or otherwise determines a calibrated sensor parameter value for one or more adjustable sensor parameters associated with the sensor device 102 while the sensor device 102 is in calibration mode. For example, when the sensor device 102 is set to calibration mode, the adjustment determination component 116 may be configured to receive, and/or identify, an actual reading value output by the sensor device 102 for a given simulated calibration output. For example, the adjustment determination component 116 may read the actual reading value produced by the sensor device 102, or receive an input signal representing the actual reading value produced by the sensor device 102. In some embodiments, the adjustment determination component 116 determines one or more calibrated parameter value(s) for a particular adjustable sensor parameter utilizing one or more formulas. The adjustment determination component 116 may include circuitry, including a memory having computer-coded instructions therein and a processor, for performing the formulas for determining the calibrated sensor parameter value(s). For example, the adjustment determination component 116 may be associated with one or more components of the circuitry 10, such as the processor 12 and/or memory 14. The adjustment determination component 116 may determine a calibration error associated with the sensor device using an actual reading value, and the corresponding simulated calibration output and/or an expected reading value for the corresponding simulated calibration output. In some example embodiments, the adjustment determination component may retrieve, calculate, or otherwise determine an expected reading value for the simulated calibration output, and determine the calibration error using the actual reading value for the simulated calibration output and the expected reading value for the simulated calibration output.

The adjustment determination component 116 may track multiple calibration errors for multiple simulated calibration outputs utilized during multi-point shunt calibration as described herein. For example, each simulated calibration output may be associated with a calibration error that represents a difference between the expected reading value and the actual reading value output by the sensor device 102. The adjustment determination component 116 may generate, calculate and/or otherwise determine one or more calibrated sensor parameter values for one or more adjustable sensor parameter(s) associated with the sensor device 102 based on the various calibration errors associated with the various simulated calibration outputs.

In some embodiments, the adjustment determination component 116 may be configured to generate, determine, and/or calculate, a calibrated sensor parameter value for one or more adjustable sensor parameters utilizing one or more formulas. For example, the adjustment determination component 116 may be embodied by the circuitry 10, or one or more sub-components thereof, and utilize the processor 12, memory 14, and/or multi-point shunt calibration system 22 to execute one or more formulas for generating, determining, and/or calculating a calibrated sensor parameter value for one or more adjustable sensor parameters. In some embodiments, the multi-point shunt calibration database 24 may be accessed to retrieve instructions and/or formula information for generating, determining, and/or calculating the various calibrated sensor parameter values for the various adjustable sensor parameters.

In some embodiments, the adjustment determination component 116 may be configured to identify and/or utilize one or more predefined formulas for determining one or more calibrated parameter value(s) for one or more adjustable sensor parameters. For example, the adjustment determination component 116 may retrieve instructions for performing the predefined formula. In a particular example embodiment, the adjustment determination component 116 may determine at least one calibrated sensor parameter value for a terminal based non-linearity parameter at a percentage of full scale, where the calibrated sensor parameter value is based on the following formula, which represents a particular parameter value formula. The adjustment determination component 116 may include circuitry for identifying, retrieving and executing instructions for performing the particular formula (s), for example utilizing the processor 12, memory 14, and/or multi-point shunt calibration system 22 of the circuitry 10:

$$\text{Terminal Based } \textit{NonLinearity } [\% \text{ of Full Scale}] = \frac{\left(\text{Sensor Output at } 50\% - \frac{\text{Sensor Output at } 0\% + \text{Sensor Output at } 100\%}{2}\right) * 100}{\text{Sensor Output at } 100\% - \text{Sensor Output at } 0\%}$$

In some embodiments, multiple calibrated sensor parameter value(s) are set, each set associated with a simulated calibration output, an actual reading value, and/or an expected reading value (e.g., a percentage of full scale). The calibrated sensor parameter value(s) for the terminal based non-linearity parameter may be utilized to detect and, if needed, correct a non-linearity error associated with the sensor device. For example, based on the calibrated sensor parameter value(s) for the non-linearity parameter, a higher order polynomial may be used to adjust the actual reading value provided by the sensor device to produce a calibrated reading value. Alternatively, in some embodiments, the calibrated sensor parameter value(s) for the non-linearity calibrated parameter (and/or calibrated sensor parameter value(s) for other adjustable sensor parameters) may be used to define a calibrated lookup table between 0% and 100% range of full scale, which may be utilized to correct one or more errors associated with the sensor device and determine/produce calibrated reading values when the sensor device is in measuring mode.

Additionally or alternatively, for example, the adjustment determination component 116 may determine at least one calibrated sensor parameter value for a hysteresis parameter. For example, the calibrated sensor parameter value(s) for the hysteresis parameter may be based on one or more of the actual reading values and/or expected reading values at different points in a predefined output sequence. For example, a plurality of simulated calibration outputs may be outputted while going up a particular predefined output sequence (e.g., 0% to 25%, to 50%, to 75%, to 100%) and associated with various actual reading values, and a plurality of simulated calibration output may be outputted while going down the particular predefined output sequence (e.g., 100% to 75%, to 50%, to 25%, to 0%) and associated with various actual reading values outputted by the sensor device, such that an adjustable sensor parameters may be determined based on the following formula, which represents a particular formula. The adjustment determination component 116 may include circuitry for identifying, retrieving and executing instructions for performing the formula or formulas, for example utilizing the processor 12, memory 14, and/or multi-point shunt calibration system 22 of the circuitry 10:

$$\text{Hysteresis [\% of Full Scale]} = \frac{\left(\begin{array}{c}\text{Sensor Output at 50\% Going Up} -\\ \text{Sensor Output at 50\% Going Down}\end{array}\right)*100}{\text{Sensor Output at 100\%} - \text{Sensor Output at 0\%}}$$

The calibrated sensor parameter value(s) for the hysteresis parameter may be utilized to detect and/or assign uncertainty associated with calibrated reading values produced by the sensor device. Thus, an operator may identify when the sensor device does not measure within a desired accuracy range, and requires different subcomponents to improve accuracy of the produced calibrated reading values (e.g., components less vulnerable to hysteresis effect). Additionally or alternatively, the calibrated sensor parameter value(s) for the hysteresis parameter may displayed to an operator, such as via a display associated with the sensor device and/or a calibration component. The calibrated sensor parameter value(s) for the hysteresis parameter enable the operator and/or the sensor device, system, or a component thereof, to select data acquisition components and/or subsystems that minimize the hysteresis error.

It should be appreciated that additional and/or alternative adjustable sensor parameters may be associated with a sensor device. For example, calibrated sensor parameter values may be determined and/or set for a dead zone parameter, such that the calibrated sensor parameter value(s) may be used to remove dead zones associated with the sensor device, for example by utilizing a calibrated lookup table. It should be appreciated that the above adjustable sensor parameters, calibrated sensor parameter value(s), algorithms/formulas, and the like, are non-limiting examples and not to limit the scope and spirit of the disclosure herein.

In other embodiments, the adjustment determination component 116 includes hardware, circuitry, and/or the like, for receiving, determining, or otherwise identifying one or more calibrated sensor parameter values for one or more adjustable sensor parameters associated with the sensor device 102. For example, the adjustment determination component 116 may include one or more digital and/or analog inputs for receiving a calibrated sensor parameter value set by a human operator (for example, via a display associated with the sensor adjustment component 114, calibration component 108, and/or sensor device 102). In some embodiments, the adjustment determination component 116 receives a digital signal that represents one or more calibrated sensor parameter values, for example in response to engagement with one or more physical components of the adjustment determination component 116.

The adjustment component 116 may, for example, communicate with the processor 12, I/O module 18, and/or memory 14 for receiving the digital signal that represents one or more calibrated sensor parameter values. The adjustment component may, additionally or alternatively, utilize the processor 12, memory 14, multi-point shunt calibration system 22, and/or the like, to interpret the received digital signal and determine the calibrated sensor parameter values for one or more adjustable sensor parameter.

The sensor adjustment component 114 includes adjustment setting component 118. Sensor adjustment component 114 includes hardware, circuitry, and/or the like for setting and/or maintaining one or more adjustable sensor parameters for the sensor device 102. In some embodiments, the adjustable setting component includes a non-volatile memory device for storing calibrated values for the one or more adjustable sensor parameters for the sensor device 102. For example, the non-volatile memory device may store a value for zero adjustment, gain adjustment, balance adjustment, or the like. In some embodiments, the non-volatile memory is a component of the sensor device 102.

The adjustment setting component 118 may be configured to set one or more calibrated sensor parameter values for each of the adjustable sensor parameters while the sensor device 102 is in calibration mode. The calibration values for each adjustable sensor parameter may be determined by and/or received from adjustment determination component 116. In some embodiments, the adjustment setting component 118 writes the calibration values for one or more adjustable sensor parameters, determined by and/or received from the adjustment determination component 116, to the non-volatile memory. The sensor device 102 may access the non-volatile memory in a measuring mode and retrieve the currently stored calibration values for the one or more adjustable sensor parameters. Utilizing the calibration values, the sensor device 102 may adjust the reading value output for a sensed input.

Alternatively, in some embodiments, the adjustment setting component 118 includes hardware, circuitry, and/or the like for adjusting one or more physical components of the sensor device 102. The adjustment setting component 118 may be connected to one or more components of the sensor device 102, and include an adjustable component for setting one or more physical properties associated with the connected components of the sensor device 102. For example, the adjustment setting component 118 may include devices, components, or other means for adjusting a resistance of a physical component of the sensor device 102 (e.g., adjusting a resistance of a resistor in measuring bridge component 104.

In some embodiments, the adjustment setting component 118 is embodied by, or associated with, one or more components of the circuitry 10. For example in some embodiments, the processor 12 and/or multi-point shunt calibration system 22 are utilized to store the calibrated sensor parameter value(s) in a database, such as memory 14 and/or multi-point shunt calibration database 24. The calibrated sensor parameter values may be retrieved from the database, such as memory 14 and/or multi-point shunt calibration database 24, in both measuring mode and calibration mode to affect reading values output by the sensor device.

It should be appreciated that, in other embodiments, an alternative arrangement and/or combination of the components 102-118 may be utilized. For example, in some embodiments, the components may perform operations additional or alternative to those described above. In some embodiments, the components may be combined, such that a single component performs the operations of two or more of the components 102-118 as described above, or operations of three of the components, four of the components, and the like. For example, the calibration component 108 may be combined with the shunt calibration component 106, such that the operations of the calibration component 108 may be performed by the shunt calibration component 106, the sensor device 102, and/or a combination thereof. For example, the sensor adjustment component 114 may be combined with the shunt calibration component 106, sensor device 102, and/or calibration component 108, such that the operations performed by sensor adjustment component 114 may be performed by the shunt calibration component 106, calibration component 108, or a combination thereof. Indeed, in some embodiments, a sensor device may include all subcomponents, such that the sensor device includes hardware and software for performing all operations described herein. Additionally or alternatively to the description above, in some embodiments, one or more of the sensor device 102, calibration component 108, sensor adjustment component 114, or a combination thereof, may utilize one or more of the components of circuitry 10. Accordingly, it should be appreciated that the particular apparatus depicted in FIG. 2 is a non-limiting example, and not to limit the scope and/or spirit of the disclosure herein.

Example Multi-Point Shunt Calibration Apparatuses

FIG. 3 illustrates a block diagram showing data flow between components of an example multi-point shunt calibration system 200 in accordance with example embodiments of the present disclosure. The components illustrated in FIG. 3 may embody a sensor device and/or a calibration component integrated or otherwise associated with the sensor device. For example, the components illustrated in FIG. 3 may embody one or more components of the apparatus 100, such as the calibration component 108, shunt calibration component 106, and/or a combination thereof. In some embodiments, the multi-point shunt calibration system 200 includes, is embodied by, or is otherwise associated with circuitry 10, and/or components thereof. For example, in some embodiments, the multi-point shunt calibration system 200 is configured to communicate with one or more of the components of circuitry 10, such as processor 12, memory 14, multi-point shunt calibration system 22, and/or a combination thereof.

Components illustrated in dashed lines are capable of performing similar functions, as described below, such that only one of the components may be necessary. In some embodiments, one of the components illustrated in dashed lines may be removed. In other embodiments, both components may be included such that only one component controls at any given time.

The apparatus 200 may include calibration switch 202A for activating and/or deactivating calibration mode, and/or adjusting the simulated calibration output while in calibration mode (for example, according to a predefined output sequence). The calibration switch 202A outputs a switch status signal 204A. In some embodiments, the switch status signal 204A represents a calibration initialization signal when the calibration switch 202A is activated/engaged (e.g., indicating that calibration mode should be activated). In some embodiments, the calibration initialization signal initializes the multi-point shunt calibration microcontroller 206 to begin outputting based on a predefined output sequence associated with an automatic output time shift interval. The calibration switch 202A may output a switch status signal 204A that represents a calibration deinitialization signal when the calibration switch 202A is deactivated/disengaged (e.g., indicating that calibration mode should be deactivated and/or measuring mode should be activated). The calibration deinitialization signal may causes the multi-point shunt calibration microcontroller to stop outputting simulated calibration outputs based on the predefined output sequence.

In other embodiments, the switch status signal 204A represents an output adjustment signal when the switch is activated/engaged in calibration mode. The output adjustment signal may cause the multi-point shunt calibration microcontroller 206 to adjust the interpretable calibration value 208 being outputted. For example, engagement with the calibration switch 202A may output an output adjustment signal to cause the multi-point shunt calibration microcontroller 206 to produce the interpretable calibration value 208 at a next value associated with various simulated calibration outputs in a predefined output sequence. In some embodiments, the calibration switch 202A may be utilized to cause outputting of the next simulated calibration output according to a predefined output sequence when the predefined output sequence and/or multi-point shunt calibration microcontroller 206 are not associated with an automatic output shift time interval, such that a given simulated calibration output is continuously outputted until the output adjustment signal is received.

The calibration switch 202A may include multiple subcomponents for activating calibration mode, deactivating calibration mode, and/or adjusting the presently outputted simulated calibration output. For example, the calibration switch may include a digital switch and/or analog switch for each purpose, or a single digital or analog switch for activating/deactivating calibration mode and another digital or analog switch for adjusting the presently outputted simulated calibration output.

In some embodiments, the calibration switch 202A is embodied by a calibration switch circuit. The calibration switch circuit is configured to output a switch status signal indicating whether calibration mode should be active. The switch status signal is output to the multi-point shunt calibration microcontroller 206, and utilized by multi-point shunt calibration microcontroller 206 as input. It should be appreciated that the calibration switch circuit may be embodied by various components and/or circuitry. For example, the calibration switch 202A may be embodied, in some embodiments, by the calibration switch circuit 400 illustrated in FIG. 5, as will be described further below.

The apparatus 200, alternatively or additionally, may include calibration command control 202B. The calibration command control 202B may be configured for activating and/or deactivating calibration mode, and/or adjusting the simulated calibration output while in calibration mode (for example, according to a predefined output sequence). The calibration command control 202B outputs a command control status signal 204B. In some embodiments, the command control status signal 204B represents a calibration initialization signal when the calibration command control 202B is activated/engaged (e.g., indicating that calibration mode should be activated). In some embodiments, the calibration initialization signal initializes the multi-point shunt calibration microcontroller 206 to begin outputting based on a predefined output sequence associated with an automatic output time shift interval. The calibration command control 202B may output a command control status signal 204B that represents a calibration deinitialization signal when the calibration command control 202B is deactivated/disengaged (e.g., indicating that calibration mode should be deactivated and/or measuring mode should be activated). The calibration deinitialization signal may cause the multi-point shunt calibration microcontroller 206 to stop outputting simulated calibration outputs based on the predefined output sequence.

In other embodiments, the command control status signal 204B represents an output adjustment signal when the calibration command control 202B is activated/engaged in calibration mode. The output adjustment signal may cause the cause the multi-point shunt calibration microcontroller 206 to adjust the simulated calibration output being outputted. For example, engagement with the calibration command control 202B may produce an output adjustment signal to cause the multi-point shunt calibration microcontroller 206 to produce the simulated calibration output that is adjacent to the presently outputted simulated calibration output in a predefined output sequence. In some embodiments, the calibration command control 202B may be utilized to cause outputting of the next simulated calibration output according to a predefined output sequence when the predefined output sequence and/or multi-point shunt calibration microcontroller 206 are not associated with an automatic output shift time interval, such that a given simulated calibration output is continuously outputted until the output adjustment signal is received.

The calibration command control 202B may embody a software and/or hardware version of the calibration switch 202A. The calibration command control 202B may be embodied entirely by software, such as software executed on a processor, for example via the circuitry 10. In some embodiments, the calibration command control 202B includes software and/or hardware for facilitating communication between a sensor device and a calibration component/system via digital means. The calibration command control 202B may include a digital communications interface for connecting the sensor and a personal computing device, processor, or other system configured for initializing and/or managing multi-point shunt calibration via the multi-point shunt calibration microcontroller 206. For example, the calibration command control 202B may include a USB 2.0, USB 3.0, Ethernet, or other digital communications interface for receiving a command signal from another device (e.g., a connected PC, laptop, processor, or system). The calibration command control 202B may include one or more inputs for activating calibration mode (such as by transmitting a calibration initialization signal), adjusting the presently outputted simulated calibration output (such as by transmitting an output adjustment signal), and/or deactivating calibration mode (such as by transmitting a calibration deinitialization signal).

The apparatus 200 includes multi-point shunt calibration microcontroller 206. The multi-point shunt calibration microcontroller 206 takes, as input, for example, switch status signal 204A or command control status signal 204B. The multi-point shunt calibration microcontroller 206 may include, or be associated with, a memory storing computer coded instructions, which cause the multi-point shunt calibration controller to perform the one or more operations described herein. For example, the multi-point shunt calibration microcontroller 206 may be embodied by circuitry 10, one or more components thereof, and/or communicable with the circuitry 10. The memory 14 and/or multi-point shunt calibration database 24 may be accessed to retrieve stored computer-coded instructions for performing the operations described herein with respect to the multi-point shunt calibration microcontroller 206. The microcontroller 206, for example using the processor 12 and/or multi-point shunt calibration system 22, may execute the instructions based on the inputs 204A or 204B.

In the embodiment illustrated in FIG. 3, the multi-point shunt calibration microcontroller 206 is configured to output an interpretable calibration value 208 while calibration mode is active. For example, the multi-point shunt calibration microcontroller 206 may determine calibration mode is active, or activate calibration mode, based on the switch status signal 204A (e.g., when the switch status signal 204A represents a calibration initialization signal) or command control status signal 204B. One of the signals may drive the multi-point shunt calibration microcontroller 206 to determine and output an interpretable calibration value.

In some embodiments, the multi-point shunt calibration microcontroller 206 embodies, via hardware and/or software, a multi-point shunt calibration state machine associated with a particular predefined output sequence, where each state in the multi-point shunt calibration state machine represents a particular interpretable calibration value 208 corresponding to a particular simulated calibration output in the predefined output sequence. For example, the multi-point shunt calibration state machine may represent the predefined output sequence provided in Table 1 (below). The multi-point shunt calibration microcontroller 206 may activate calibration mode and/or initialize the multi-point shunt calibration state machine at an initial calibration output when the input switch status signal 204A or command control status signal 204B represents a calibration initialization signal. The multi-point shunt calibration microcontroller may continue outputting interpretable calibration value 208 based on the predefined output sequence until a calibration deinitialization signal is received (for example, via switch status signal 204A or command control status signal 204B).

In some embodiments, the multi-point shunt calibration microcontroller 206 is associated with an automatic output time shift interval. For example, the multi-point shunt calibration microcontroller 206 may continue outputting a particular interpretable calibration value 208 (associated with a corresponding simulated calibration output) for the automatic output time shift interval. The multi-point shunt calibration microcontroller may operate a timer to track an output time associated with the currently outputted interpretable calibration value 208, and alter output of the interpretable calibration value 208 to be a next interpretable calibration value based on the predefined output sequence after the output time exceeds the automatic output time shift interval. For example, the currently produced interpretable calibration value 208 may be associated with a first simulated calibration output, and may be adjusted to correspond to a second simulated calibration output that is adjacent to the first simulated calibration output in the defined output sequence. In some embodiments, the multi-point shunt calibration microcontroller 206 outputs various interpretable calibration values 208 using time division multiplexing. In some embodiments, each interpretable calibration value 208 in a predefined output sequence is outputted by the multi-point shunt calibration microcontroller 206 utilizing time division multiplexing associated with an automatic output time shift interval. For example, the multi-point shunt calibration microcontroller 206 may embody an automated multi-point shunt calibration state machine such that each state in the automated multi-point shunt calibration state machine represents an interpretable calibration value 208 associated with a predefined output sequence. The automated multi-point shunt calibration state machine may change states based on an automatic output time shift interval for each state, such that the interpretable calibration value 208 changes over time. In some embodiments, the multi-point shunt calibration microcontroller 206 continues outputting the interpretable calibration value 208 based on the predefined output sequence until a calibration deinitialization signal is received, and may repeat the predefined output sequence (or a portion thereof) one or more times.

In other embodiments, the switch status signal 204A or command control status signal 204B controls the interpretable calibration value 208 outputted by the multi-point shunt calibration microcontroller 206. For example, in some embodiments, the multi-point shunt calibration microcontroller 206 is associated with a predefined output sequence, and continues to output a particular interpretable calibration value 208 until switch status signal 204A or command control status signal 204B represents an output adjustment signal. Upon receiving the output adjustment signal, the multi-point shunt calibration microcontroller may produce the next interpretable calibration value 208 based on the predefined output sequence (for example, by adjusting up or down to represent a value that corresponds to an adjacent simulated calibration output). In some embodiments, an operator may control the multi-point shunt calibration microcontroller 206 (and, thus, the length of time a particular interpretable calibration value 208 is outputted for) utilizing the calibration switch 202A or calibration command control 202B.

Additionally or alternatively, in some embodiments, one or more of the calibration switch 202A, calibration command control 202B, and/or multi-point shunt calibration microcontroller 206 may be combined. For example, in some embodiments, the multi-point shunt calibration microcontroller 206 includes hardware, circuitry, software, and/or a combination thereof to operate as the calibration switch 202A or calibration command control 202B.

The interpretable calibration value 208 output from multi-point shunt calibration microcontroller 206 is input into digital-to-analog converter 210. The digital-to-analog converter 210 is configured to convert the interpretable calibration value 208 into a corresponding converted calibration signal 212. For example, the digital-to-analog converter 210 may be configured to output a converted calibration signal 212 that corresponds to a specific voltage based on the interpretable calibration value 208.

Converted calibration signal 212 is output by digital-to-analog converter 210 as input to output driver 214. The output driver 214 may output a simulated calibration output 216 based on the converted calibration signal 212. In some embodiments, the output driver 214 may be a voltage output driver. In other embodiments, the output driver 214 may be a current output driver. The simulated calibration output 216 may be output to the sensor device, for example to a measuring bridge circuit of the sensor device, to cause the sensor device to produce a reading value based on the simulated calibration output 216. The particular value of simulated calibration output 216 may be determined at any given time, for example based on the command control status signal 204B, interpretable calibration value 208, and/or converted calibration signal 212. Thus, when outputted to a sensor device, the simulated calibration output 216 drives the sensor device to produce an actual reading value that may be compared with an expected reading value to calibrate the sensor device.

In a particular example, the multi-point shunt calibration microcontroller 206 is configured to generate specific interpretable calibration values having values that drive the digital-to-analog converter 210 to produce known calibrated calibration signals. Similarly, each converted calibration signal may be associated with a known simulated calibration output. Further, each simulated calibration output may be associated with an expected reading value (for example, a certain percentage of full scale). Similarly, each of the signals/values may be associated with a predefined output sequence, and/or automatically follow a predefined output sequence based on time-division multiplexing.

The multi-point shunt calibration apparatus 200 may adjust the value of simulated calibration output 216 based on a defined sequence controlled by multi-point shunt calibration microcontroller 206. For example, the multi-point shunt calibration apparatus 200 may be associated with an automatic output shift time interval, and/or an output step size between adjacent simulated calibration outputs. For example, the multi-point shunt calibration apparatus 200 may continuously produce various simulated calibration outputs based on a predefined output sequence, such as simulated calibration outputs including an upper boundary simulated calibration output, at least one intermediate simulated calibration output, and a lower boundary simulated calibration output, for example starting from the upper or lower boundary simulated calibration output and cycling one, two, three, or more times.

The following Table 1 is an example of corresponding interpretable calibration values, converted calibration signals, simulated calibration outputs, and expected reading values for an example predefined output sequence. Specifically, the predefined output sequence exemplified in Table 1 includes a full cycle with a step size of 25% of full scale for a given sensor. It should be appreciated that the specific values in Table 1 are non-limiting examples only.

For instance, the expected reading values may be 1%, 5%, 10%, 15%, 20%, 25%, 30%, 35%, 40%, 45%, 50%, 55%, 60%, 65%, 70%, 75%, 80%, 85%, 90%, 95%, 99%, 100%, or more values, or any combination thereof. A predefined output sequence may include, in some embodiments, 1, 2, 3, 4, 5, 6, 7, or more steps including any portion of the full scale of a sensor in various increments. For instance, the predefined output sequence may run from 15% to 75% of full scale in various increments (e.g., 5% step size, 10% step size, or the like), 10% to 80% of full scale in various increments (e.g., 5% step size, 10% step size, or the like), or other ranges.

TABLE 1

Example Signal Values for Interpretable Calibration Value, Simulated Calibration Output, and Expected Reading Value

| Interpretable calibration value | Converted Calibration Signal | Simulated Calibration Output | Expected Reading Value |
| --- | --- | --- | --- |
| 0 | 0 volts | −10 volts | 0% Full Scale |
| 16384 | 0.625 volts | −5 volts | 25% Full Scale |
| 32768 | 1.25 volts | 0 volts | 50% Full Scale |
| 49152 | 1.875 volts | 5 volts | 75% Full Scale |
| 65535 | 2.5 volts | 10 volts | 100% Full Scale |
| 49152 | 1.875 volts | 5 volts | 75% Full Scale |
| 32768 | 1.25 volts | 0 volts | 50% Full Scale |
| 16384 | 0.625 volts | −5 volts | 25% Full Scale |
| 0 | 0 volts | −10 volts | 0% Full Scale |

The predefined output sequence defines a specific predefined output sequence, which begins at an initial calibration output equal to a lower boundary simulated calibration output representing 0% of Full Scale, and first increases the value of each simulated calibration output according to a percentage step size of 25% of Full Scale until reaching an upper boundary simulated calibration output representing 100% of full scale. The predefined output sequence then decreases the value of each simulated calibration output, also by a percentage step size of 25% of Full Scale, until reaching the lower boundary simulated calibration output representing 0% again. The predefined output sequence may repeat in this cycle, for example after returning to the initial simulated calibration output, for one or more times.

It should be appreciated that the actual reading value produced by the sensor when increasing the value of the simulated calibration output in the predefined output sequence may not equal the actual reading value produced by the sensor when decreasing the value of the simulated calibration output. In some embodiments, the differences in actual reading values produced by the sensor device when increasing/decreasing is used to detect one or more sensor errors, and/or determine and set a calibrated sensor parameter values for one or more adjustable sensor parameters associated with the sensor error(s). For example, hysteresis errors may be detected based on such differences between actual reading values produced by the sensor device at the same simulated calibration output when increasing/decreasing (for example, differences between reading values produced when outputting 75% of Full Scale after 50% of Full Scale on the way up to the upper limit calibration output, and when outputting 75% of Full Scale after 100% of Full Scale on the way down to the lower limit calibration output). The predefined output sequence should be followed such that the simulated calibration output does not jump between or otherwise skip values. For example, if any transient state caused outputting of a simulated calibration output out of order, detection of one or more errors may be affected. For example, in accordance with the predefined output sequence illustrated in FIG. 1, if the simulated calibration output was outputted at 0% of Full Scale for a short duration while transitioning down from 75% of Full Scale to 50% of Full Scale a simulated calibration value associated with 50% of Full Scale may be incorrect and require re-calibration. The predefined output sequence may be outputted many times (e.g., repeated 1 or more times) to minimize the effects of possible transient states.

FIG. 4 illustrates a block diagram showing data flow between components of an example multi-point shunt calibration apparatus 300 in accordance with example embodiments of the present disclosure. The components illustrated in FIG. 4 may embody a calibration component integrated in a sensor device, or otherwise associated with a sensor device. For example, the components illustrated in FIG. 4 may embody one or more components of the apparatus 100, such as the calibration component 108, shunt calibration component 106, and/or a combination thereof. In some embodiments, the multi-point shunt calibration system 200 includes, is embodied by, or is otherwise associated with circuitry 10, and/or components thereof. For example, in some embodiments, the multi-point shunt calibration system 200 is configured to communicate with one or more of the components of circuitry 10, such as processor 12, memory 14, multi-point shunt calibration system 22, and/or a combination thereof.

Components illustrated in dashed lines are capable of performing similar functions, as described below, such that only one of the components may be necessary. In some embodiments, one of the components illustrated in dashed lines may be removed. In other embodiments, both components may be included such that only one component controls at any given time.

The apparatus 300 may include calibration switch 202A for activating and/or deactivating calibration mode, and/or adjusting the simulated calibration output while in calibration mode (for example, according to a predefined output sequence). The calibration switch 202A outputs a switch status signal 204A. In some embodiments, the switch status signal 204A represents a calibration initialization signal when the calibration switch 202A is activated/engaged (e.g., indicating that calibration mode should be activated). In some embodiments, the calibration initialization signal initializes the multi-point shunt calibration microcontroller 306 to begin outputting based on a predefined output sequence associated with an automatic output time shift interval. The calibration switch 202A may output a switch status signal 204A that represents a calibration deinitialization signal when the calibration switch 202A is deactivated/disengaged (e.g., indicating that calibration mode should be deactivated and/or measuring mode should be activated). The calibration deinitialization signal may causes the multi-point shunt calibration microcontroller to stop outputting simulated calibration outputs based on the predefined output sequence.

In other embodiments, the switch status signal 204A represents an output adjustment signal when the switch is activated/engaged in calibration mode. The output adjustment signal may cause the multi-point shunt calibration microcontroller 306 to adjust the pulse width modulated calibration value 308 being outputted. For example, engagement with the calibration switch 202A may output an output adjustment signal to cause the multi-point shunt calibration microcontroller 306 to produce the pulse width modulated calibration value 308 corresponding to the next simulated calibration output in a predefined output sequence. In some embodiments, the calibration switch 202A may be utilized to cause outputting of the next simulated calibration output according to a predefined output sequence when the predefined output sequence and/or multi-point shunt calibration microcontroller 306 are not associated with an automatic output shift time interval, such that a given simulated calibration output is continuously outputted by the apparatus 300 until the output adjustment signal is received.

The calibration switch 202A may include multiple sub-components for activating calibration mode, deactivating calibration mode, and/or adjusting the presently outputted simulated calibration output. For example, the calibration switch may include a digital switch and/or analog switch for each purpose, or a single digital or analog switch for activating/deactivating calibration mode and another digital or analog switch for adjusting the presently outputted simulated calibration output.

In some embodiments, the calibration switch 202A is embodied by a calibration switch circuit. The calibration switch circuit is configured to output a switch status signal indicating whether calibration mode should be active. The switch status signal is output to the multi-point shunt calibration microcontroller 306, and utilized by multi-point shunt calibration microcontroller 306 as input. It should be appreciated that the calibration switch circuit may be embodied by various components and/or circuitry. For example, the calibration switch 202A may be embodied, in some embodiments, by the calibration switch circuit 400 illustrated in FIG. 5, as will be described further below.

The apparatus 300, alternatively or additionally, may include calibration command control 202B. The calibration command control 202B may be configured for activating and/or deactivating calibration mode, and/or adjusting the simulated calibration output while in calibration mode (for example, according to a predefined output sequence). The calibration command control 202B outputs a command control status signal 204B. In some embodiments, the command control status signal 204B represents a calibration initialization signal when the calibration command control 202B is activated/engaged (e.g., indicating that calibration mode should be activated). In some embodiments, the calibration initialization signal initializes the multi-point shunt calibration microcontroller 306 to begin outputting based on a predefined output sequence associated with an automatic output time shift interval. The calibration command control 202B may output a command control status signal 204B that represents a calibration deinitialization signal when the calibration command control 202B is deactivated/disengaged (e.g., indicating that calibration mode should be deactivated and/or measuring mode should be activated). The calibration deinitialization signal may cause the multi-point shunt calibration microcontroller 306 to stop outputting simulated calibration outputs based on the predefined output sequence.

In other embodiments, the command control status signal 204B represents an output adjustment signal when the calibration command control 202B is activated/engaged in calibration mode. The output adjustment signal may cause the cause the multi-point shunt calibration microcontroller 306 to adjust the simulated calibration output being outputted. For example, engagement with the calibration command control 202B may produce an output adjustment signal to cause the multi-point shunt calibration microcontroller 306 to produce the simulated calibration output at a next value in a predefined output sequence. In some embodiments, the calibration command control 202B may be utilized to cause outputting of the next simulated calibration output according to a predefined output sequence when the predefined output sequence and/or multi-point shunt calibration microcontroller 306 are not associated with an automatic output shift time interval, such that a given simulated calibration output is continuously outputted until the output adjustment signal is received.

The calibration command control 202B may embody a software and/or hardware version of the calibration switch 202A. For example, the calibration command control 202B may be embodied entirely of software executed by a processing circuitry, such as via circuitry 10 or a component thereof. In some embodiments, the calibration command control 202B includes software and/or hardware for facilitating communication between a sensor device and a calibration component/system via digital means. The calibration command control 202B may include a digital communications interface for connecting the sensor and a personal computing device, processor, or other system configured for initializing and/or managing multi-point shunt calibration via the multi-point shunt calibration microcontroller 306. For example, the calibration command control 202B may include a USB 2.0, USB 3.0, Ethernet, or other digital communications interface for receiving a command signal from another device (e.g., a connected PC, laptop, processor, or system).

The apparatus 300 includes multi-point shunt calibration microcontroller 306. The multi-point shunt calibration microcontroller 306 takes, as input, for example, switch status signal 204A or command control status signal 204B. The multi-point shunt calibration microcontroller 306 may include, or be associated with, a memory storing computer coded instructions, which cause the multi-point shunt calibration controller to perform the one or more operations described herein. For example, the multi-point shunt calibration microcontroller 306 may be embodied by circuitry 10, one or more components thereof, and/or communicable with the circuitry 10. The memory 14 and/or multi-point shunt calibration database 24 may be accessed to retrieve stored computer-coded instructions for performing the operations described herein with respect to the multi-point shunt calibration microcontroller 306. The microcontroller 306, for example using the processor 12 and/or multi-point shunt calibration system 22, may execute the instructions based on the inputs 204A or 204B.

In the embodiment illustrated in FIG. 4, the multi-point shunt calibration microcontroller 306 is configured to output a pulse width modulated calibration value 308 while calibration mode is active. For example, the multi-point shunt calibration microcontroller 306 may determine calibration mode is active, or activate calibration mode, based on the switch status signal 204A (e.g., when the switch status signal 204A represents a calibration initialization signal). The command control status signal 204B may drive the multi-point shunt calibration microcontroller 306 to determine and output a pulse width modulated calibration value 308. The pulse width modulated calibration value 308 may correspond to a known value of fixed-frequency pulse train with pulses of varying width, which corresponds to a particular simulated calibration output.

In some embodiments, the multi-point shunt calibration microcontroller 306 embodies, via hardware and/or software, a multi-point shunt calibration state machine associated with a particular predefined output sequence, where each state in the multi-point shunt calibration state machine represents a particular pulse width modulated calibration value 308 corresponding to a particular simulated calibration output in the predefined output sequence. For example, the multi-point shunt calibration state machine may represent the predefined output sequence provided in Table 1 (below). The multi-point shunt calibration microcontroller 306 may activate calibration mode and/or initialize the multi-point shunt calibration state machine at an initial calibration output when the input switch status signal 204A or command control status signal 204B represents a calibration initialization signal. The multi-point shunt calibration microcontroller may continue outputting pulse width modulated calibration value 308 until a calibration deinitialization signal is received (for example, via switch status signal 204A or command control status signal 204B).

In some embodiments, the multi-point shunt calibration microcontroller 306 is associated with an automatic output time shift interval. For example, the multi-point shunt calibration microcontroller 306 may continue outputting a particular pulse width modulated calibration value 308 (associated with a corresponding simulated calibration output) for the period of time representing the automatic output time shift interval. The multi-point shunt calibration microcontroller may track an output time associated with the currently outputted pulse width modulated calibration value 308, and output a next pulse width modulated calibration value 308 based on the predefined output sequence after the output time exceeds the automatic output time shift interval. In some embodiments, the multi-point shunt calibration microcontroller 306 outputs various pulse width modulated calibration values 308 using time division multiplexing. In some embodiments, each pulse width modulated calibration value 308 in a predefined output sequence is outputted by the multi-point shunt calibration microcontroller 306 utilizing time division multiplexing associated with an automatic output time shift interval. For example, the multi-point shunt calibration microcontroller 306 may embody an automated multi-point shunt calibration state machine such that each state in the automated multi-point shunt calibration state machine represents a pulse width modulated calibration value 308 associated with a predefined output sequence. The automated multi-point shunt calibration state machine may change states based on an automatic output time shift interval for each state, such that the pulse width modulated calibration value 308 changes over time. In some embodiments, the multi-point shunt calibration microcontroller 306 continues outputting the pulse width modulated calibration value 308 based on the predefined output sequence until a calibration deinitialization signal is received, and may repeat the predefined output sequence (or a portion thereof) one or more times.

In other embodiments, the switch status signal 204A or command control status signal 204B controls the pulse width modulated calibration value 308 outputted by the multi-point shunt calibration microcontroller 306. For example, in some embodiments, the multi-point shunt calibration microcontroller 306 is associated with a predefined output sequence, and continues to output a particular pulse width modulated calibration value 308 until switch status signal 204A or command control status signal 204B represents an output adjustment signal. Upon receiving the output adjustment signal, the multi-point shunt calibration microcontroller may produce the next pulse width modulated calibration value 308 based on the predefined output sequence. In some embodiments, an operator may control the multi-point shunt calibration microcontroller 306 (and, thus, the length of time a particular pulse width modulated calibration value 308 is outputted for) utilizing the calibration switch 202A or calibration command control 202B.

The pulse width modulated calibration value 308 output from multi-point shunt calibration microcontroller 306 is input into RC Filter 310. The RC filter 310 is configured to filter the pulse width modulated calibration value 308 into a corresponding filtered calibration signal 312. For example, the RC filter 310 may be configured to output a filtered calibration signal 312 that corresponds to a specific voltage based on the duty cycle associated with the pulse width modulated calibration value 308. In other embodiments, alternative filter components may similarly be utilized.

Filtered calibration signal 312 is output by RC filter 310 as input to output driver 314. The output driver 314 may output a simulated calibration output 316 based on the filtered calibration signal 312. In some embodiments, the output driver 314 may be a voltage output driver. In other embodiments, the output driver 314 may be a current output driver. The simulated calibration output 316 may be output to the sensor device, for example to a measuring bridge circuit of a sensor device, to cause the sensor device to produce a reading value based on the simulated calibration output 316. The particular value of simulated calibration output 316 may be determinable at any given time, for example based on the switch status signal 204A or command control status signal 204B, pulse width modulated calibration value 308, and/or filtered calibration signal 312. Thus, if output to a sensor device, the simulated calibration output 316 drives the sensor device to produce an actual reading value that may be compared with an expected reading value to calibrate the sensor device.

In a particular example, the multi-point shunt calibration microcontroller 304 is configured to generate specific pulse width modulated calibration values 308 that drive the RC filter 310 to produce known filtered calibration signals 312. The pulse width modulated calibration value 308 may have a fixed-frequency pulse train with pulses of varying width to represent a particular value. Similarly, each filtered calibration signal 312 may be associated with a known simulated calibration output 316. Further, each simulated calibration output may be associated with an expected reading value (for example, a certain percentage of full scale). Similarly, each of the signals/values may be associated with a predefined output sequence, and/or automatically cycle based on time-division multiplexing.

The multi-point shunt calibration apparatus 300 may adjust the output of simulated calibration output based on a defined sequence. For example, the multi-point shunt calibration apparatus 300 may be associated with an automatic output shift time interval, and/or an output step size between subsequent simulated calibration outputs. For example, the multi-point shunt calibration apparatus 300 may be configured to cycle between an upper boundary simulated calibration output, at least one intermediate simulated calibration output, and a lower boundary simulated calibration output, for example starting from the upper or lower boundary simulated calibration output and cycling one, two, three, or more times.

FIG. 5 illustrates a calibration switch circuit 400. The calibration switch circuit 400 is an example, non-limiting embodiment of a calibration switch, for example that may embody calibration switch 202A and/or calibration switch 202A. Turning to FIG. 5, the calibration switch circuit 400 includes voltage source 402. The voltage source 402 may be switched, for example automatically or by an operator, to output a voltage V1. V1 is a sufficient voltage to produce current across Zener diode 404. In other words, V1 satisfies a Zener threshold associated with the Zener diode 404.

When voltage V1 is output from voltage source 402, optocoupler 406 is activated. Activation of optocoupler 406 causes output of a switch status signal as switch status signal 408. For example, switch status signal 408 may represent a calibration initialization signal when the voltage value of switch status signal 408 is increased based on voltage V1. When voltage V1 is not output, current cannot flow across the Zener diode 404, and thus optocoupler 406 is not activated. Accordingly, the switch status signal may represent a calibration deinitialization signal when the Zener diode is switched off.

The voltage 410 provides a default switch status signal 408, for example, based on the voltage 410 and the subsequent resistor 412. Accordingly, when the optocoupler 406 is activated, and the voltage decrease caused by the output of the optocoupler 406 adjusts the switch status signal 408. For example, in an embodiment, the switch status signal 408 is a "Logic High." When the voltage source 402 is greater than or equal to 10 volts, the switch status signal 408 changes to "Logic Low."

In some embodiments, the voltage source 402 may provide a voltage equal to or greater than 10 volts upon activation. The resistor 414 may be associated with a resistance of 820 Ohms, and the resistor 412 may be associated with a resistance of 4,700 Ohms. In some embodiments, the voltage 410 may be 3.3 volts. In some embodiments, the Zener threshold associated with the Zener diode 404 may be 7.5 volts. When the voltage source 402 is activated, current flows to activate optocoupler 406. Accordingly, the switch status signal 408 may be adjusted from a normal output, thus representing a calibration initialization signal. It should be understood that the various components illustrated in FIG. 6 may have various values, impedances, and/or the like, without deviating from the scope of the disclosure herein.

FIG. 6 illustrates an example multi-point shunt calibration circuit 500 in accordance with embodiments of the disclosure herein. The multi-point shunt calibration circuit 500 includes corresponding arrays of optocouplers 506A-506C, output adjustment switches 510A-510C and fixed resistors 512A-512C, in conjunction with reference voltage 508 and opamps 514A and 514B. It should be appreciated that, in some embodiments, alternative components may be used to those illustrated in multi-point shunt calibration circuit 500. The Voltage CC 508 may provide power to each of the components illustrated.

The multi-point shunt calibration circuit 500 receives inputs SC_PWR 502, SC_1 504A, SC_2 504B, and SC_3 504C. The inputs SC_PWR 502, SC_1 504A, SC_2 504B, and SC_3 504C may be associated with one or more calibration input components, for example a digital input component, a single multi-value calibration component, or a plurality of calibration input switches (not shown). In some embodiments, the calibration input components may be controlled by signals output from a calibration switch or a calibration command control. As illustrated, SC_PWR 502 provides positive voltage to the cathode side of the LEDs in the various optocouplers 506A-506C. SC_1 504A, SC_2 504B, and SC_3 504C include input pins and/or terminals accessible to the user. Each of the optocouplers 506A-506C may be activated utilizing SC_PWR 502 and one selected from the group of SC_1 504A, SC_2 504B, and SC_3 504C. For example, the optocoupler 506A may be activated by connecting SC_PWR 502 to a positive voltage greater than or equal to a defined voltage level (for example, 5 volts, 12 volts, or 24 volts) and by connecting SC_1 504A to 0 volts. Similarly, the optocoupler 506B may be activated by connecting SC_PWR 502 to a positive voltage greater than or equal to a defined voltage level (for example, 5 volts, 12 volts, or 24 volts) and by connecting SC_2 504B to 0 volts. Additionally, as illustrated, the optocoupler 506C may be similarly activated by connecting SC_PWR 502 to a positive voltage greater than or equal to a defined voltage level (for example, 5 volts, 12 volts, or 24 volts) and by connecting SC_3 504C to 0 volts.

The multi-point shunt calibration circuit 500 outputs simulated calibration output 516. The multi-point shunt calibration circuit 500 may output the simulated calibration output 516 to a sensor device for further processing and/or to display a corresponding reading value. The simulated calibration output 516 may be added to the analog output voltage of the sensor device to output a corresponding actual reading value. For example, if no sensed value is applied to the sensor device (e.g., the sensor device is a pressure sensor with no pressure applied to the sensor), the sensor may be driven 0 volts to output an actual reading value associated with 0 volts. A user may then initialize input SC_1 504A to be "ON"/activated, and inputs SC_2 504B and SC_3 506C to be "OFF"/deactivated, causing the multi-point shunt calibration circuit 500 to output a first simulated calibration output 516 corresponding to a first percentage of full scale. For example, when SC_1 504A only is activated, the multi-point shunt calibration circuit 500 may produce simulated calibration output 516 that corresponds to 25% of full scale (such as 1.25 volts on a 0-5 volt output sensor device). The various combinations of activating SC_1 504A, SC_2 504B, and SC_3 504C may provide different values of simulated calibration output 516, which get added to the base sensor output to produce an actual reading value based on the simulated calibration output. In an example embodiment, for example, activation of SC_1 504A and SC_2 504B may produce simulated calibration output 516 at 50% of full scale for a sensor device, activation of SC_1 504A and SC_3 504C may produce simulated calibration output 516 at 75% of full scale for the sensor device, and activation of all SC_1 504A, SC_2 504B, and SC_3 504C may produce simulated calibration output 516 at 100% of full scale for the sensor device. In other embodiments, similar results may be realized for a current output sensor, for example a 4-20 mA current output sensor.

Each of the inputs 504A-504C is associated with an optocoupler 506A-506C. The optocouplers 506A-506C are configured to transfer a signal based on the corresponding input signal 504A-504C. When the corresponding input signal is active, a corresponding output adjustment switch 510A-510C is activated. The activation of the output adjustment switches 510A-510C cause a corresponding fixed resistor 512A-512C to be connected in parallel and alter the voltage resulting from the fixed resistors switched to be included in the circuit based on reference voltage 508. The voltage resulting from the fixed resistors switched to be included in the circuit is then input into opamps 514A and 514B, which output the final simulated calibration output 516.

Each input is associated with one optocoupler, output adjustment switch, and fixed resistor. For example, the status of SC_1 504A determines the status of optocoupler 506B, which similarly determines the connection of output adjustment switch 510A. As illustrated, output adjustment switch 510A may be connected to reference voltage 508, or 0 volts. The setting of output adjustment switch 510A alters the voltage connected to the fixed resistor 512A. If SC_1 504A is "ON"/activated, optocoupler 506A is activated, which connects the fixed resistor 512A to the reference voltage 508 through output adjustment switch 510A. Alternatively, if SC_1 504A is "OFF"/deactivated, optocoupler 506A is deactivated, which connects the fixed resistor 512A to 0 volts through output adjustment switch 510A. Similarly, the status of SC_2 504B determines the status of optocoupler 506B, which similarly determines the connection of output adjustment switch 510B. Output adjustment switch 510B may be connected to reference voltage 508, or 0 volts. The setting of output adjustment switch 510B alters the voltage connected to the fixed resistor 512B. If SC_2 504B is "ON"/activated, optocoupler 506A is activated, which connects the fixed resistor 512B to the reference voltage 508 through output adjustment switch 510B. Alternatively, if SC_2 504B is "OFF"/deactivated, optocoupler 506B is deactivated, which connects the fixed resistor 512B to 0 volts through output adjustment switch 510B. This configuration is continued for SC_3 504B, and indeed may be utilized with respect to more input signals (not shown). The value of simulated calibration output 516 depends on the value of the reference voltage 508, which may be fixed, and the combinations of the various switch positions of adjustment output switches 510A-510C based on inputs SC_1 504A-504C. Accordingly, each combination of inputs SC_1 504A, SC_2 504B, and SC_3 504C (and/or other input signals), corresponds to a known simulated calibration output 516. Thus, adjusting the various inputs 504A-504C causes the multi-point shunt calibration circuit 500 to produce various simulated calibration outputs to facilitate multi-point shunt calibration.

Example Multi-Point Shunt Calibration Processes

FIGS. 7 and 8 illustrate example operations for multi-point shunt calibration of a sensor device in accordance with example embodiments of the present disclosure. It should be appreciated that the illustrated operations may be performed in various orders, and in some embodiments may include alternative or additional operations from those illustrated. The operations illustrated with respect to FIGS. 7 and 8 are illustrated by way of example, and the scope and spirit of the disclosure is not limited to the specific operations and/or processes depicted. In some embodiments, some or all of the operations illustrated in FIGS. 7 and 8 may be performed by one or more components associated calibration component configured for implementing the example processes, for example where the calibration component is attached to, included in, or otherwise associated with a sensor device.

FIG. 7 illustrates a flowchart describing example operations in a process 600 for multi-point shunt calibration of a sensor device in accordance with some example embodiments of the present disclosure. In some embodiments, one or more of the operations are performed by a multi-point shunt calibration apparatus including a multi-point shunt calibration microcontroller, the multi-point shunt calibration microcontroller configured to execute the operations based on computer coded instructions. For example, in some embodiments, the operations described with respect to FIG. 7 are performed by circuitry 10, apparatus 200, and/or apparatus 300. In some embodiments, the apparatus 200 performs one or more of the operations illustrated with respect to FIG. 7 utilizing one or more of the components of circuitry 10. In some embodiments, the apparatus 300 performs one or more of the operations illustrated with respect to FIG. 7 utilizing one or more of the components of circuitry 10.

The process 600 includes block 602 of receiving a calibration initialization signal associated with a sensor, the sensor associated with at least one adjustable sensor parameter. The calibration initialization signal indicates that the sensor is in calibration mode. The calibration initialization signal may be received in response to activation and/or engagement of a calibration mode management component.

The process 600 includes block 604 of outputting a first simulated calibration output. The first simulated calibration output may be associated with a first actual reading value (e.g., an actual reading value produced by a sensor device). The first simulated calibration output may also be associated with a first expected reading value. The first expected reading value may be stored in a non-transitory memory, such that the sensor device, an associated calibration component and/or sensor adjustment component, may retrieve the expected reading value from the non-transitory memory.

The process 600 includes block 606 of outputting a second simulated calibration output. The second simulated calibration output may be associated with a second actual reading value (e.g., an actual reading value produced by the sensor device). The second simulated calibration output may also be associated with a second expected reading value (for example, stored in a non-transitory memory).

The process 600 includes block 608 of outputting a third simulated calibration output. The third simulated calibration output may be associated with a third actual reading value (e.g., an actual reading value produced by the sensor device). The third simulated calibration output may also be associated with a third expected reading value (for example, stored in a non-transitory memory). It should be appreciated that the expected reading values may be predetermined and/or pre-calculated, and associated with and/or provided with a sensor device.

Each simulated calibration output may be output to a sensor device to cause the sensor device to output a reading value based on the simulated calibration output (e.g., an actual reading value). Each simulated calibration output may be known and/or determinable, such that for a given sensor, an expected reading value for the sensor device may also be known. In a particular example where a simulated calibration output is a voltage, for example, a first simulated calibration output of −10 volts may be associated with an expected reading value of 0% of full scale, a second simulated calibration output of 0 volts may be associated with an expected reading value of 50% of full scale, and a third simulated calibration output of 10 volts may be associated with an expected reading value of 100% of full scale.

In some embodiments, each simulated calibration output is adjusted to a new simulated calibration output based on an output step size. The first simulated calibration output may be one output step size greater than (or less than) the second simulated calibration output, and similarly the second simulated calibration output may be one output step size greater than (or less than) the third simulated calibration output. The simulated calibration outputs may be associated with a determined output sequence, for example the determined output sequence described with respect to FIG. 9 below.

The simulated calibration output may be output based on one or more input signals. In some embodiments, each of the one or more input signals associated with outputting a corresponding simulated calibration output is associated with a calibration value input component. For example, a calibration value input may be an analog signal for causing a particular simulated calibration output to be outputted by an apparatus, such as the apparatus 200 or 300, or a multi-point shunt calibration circuit, such as the multi-point shunt calibration circuit 400. In some embodiments, the one or more input signals are determined based on input from a digital input component. In other embodiments, the one or more input signals may be associated with a setting of a multi-value input component.

In some embodiments, the simulated calibration output is an output by a multi-point shunt calibration circuit. The multi-point shunt calibration circuit is configured to output a simulated calibration output based on the one or more input signals by changing various physical elements of the multi-point shunt calibration circuit based on the one or more input signals. For example, each input signal may be associated with an output adjustment switch and/or fixed resistor, such that the status of the input signal determines whether the output adjustment switch includes the fixed resistor in the multi-point shunt calibration circuit.

In other embodiments, the simulated calibration output is an output by a multi-point shunt apparatus including a multi-point shunt calibration microcontroller. The multi-point shunt calibration microcontroller may receive a switch status signal or a command control status signal. The switch status signal or command control status signal may represent a calibration initialization signal when calibration mode is activated, for example when the component (or a subcomponent thereof) is activated via engagement by a user.

In some embodiments, the calibration switch (or calibration command control) is configured to output a switch status signal (or command control status signal) that represents an output adjustment signal to the multi-point shunt calibration microcontroller to adjust the output produced by the multi-point shunt calibration microcontroller. The calibration switch or calibration command control may include a timer for automatically outputting the output adjustment signal, for example based on one or more automatic output time shift intervals.

In some embodiments, the multi-point shunt calibration microcontroller outputs a representative calibration value that is set or adjusted based on the switch status signal or command control status signal. For example, the multi-point shunt calibration microcontroller, upon receiving a calibration initialization signal, may output an initial representative calibration value corresponding to an initial simulated calibration output in a predefined output sequence. The multi-point shunt calibration microcontroller may then output an adjacent representative calibration value when an output adjustment signal is received. In some embodiments, the representative calibration value is a pulse width modulated calibration value that is output from the multi-point shunt calibration microcontroller to a RC filter. The pulse width modulated calibration value may represent different values based on the pulse width of the signal. For example, in some embodiments, a pulse width modulated calibration value having a higher duty cycle is associated with a higher command control status signal, and thus associated with a higher simulated calibration output.

The RC filter outputs a corresponding filtered calibration signal based on the pulse width modulated calibration value. The corresponding filtered calibration signal is input into an output driver that outputs the corresponding simulated calibration output, which drives the sensor device to provide a corresponding reading value.

In other embodiments the representative calibration value is an interpretable calibration value that is output from the multi-point shunt calibration microcontroller to a digital-to-analog converter. The digital-to-analog converter outputs a corresponding converted calibration signal. The corresponding converted calibration signal is input into an output driver that outputs the corresponding simulated output based on the converted calibration signal. The simulated calibration output drives the sensor device to provide a corresponding reading value.

The process 600 includes optional block 610 of outputting at least one additional simulated calibration output, each additional simulated calibration output associated with an additional expected reading value and an additional actual reading value. By outputting additional simulated calibration outputs, more actual reading values may be determined and utilized in calibrating one or more adjustable sensor components.

The process 600 includes optional block 612 of determining a calibrated sensor parameter value for the calibrated sensor parameter based on at least (1) the first actual reading value, (2) the second actual reading value, and (3) the third actual reading value. In some embodiments, the calibrated sensor parameter value is also based on at least one additional actual reading value and at least one expected additional reading value. In other embodiments, the calibration sensor parameter value may, additionally or alternatively, be based on at least the first, second, and third expected reading values.

In some embodiments, the calibrated sensor parameter value is determined automatically. For example, in some embodiments, a sensor device and/or calibration component is pre-programmed, or otherwise identifies one or more formulas for determining the calibrated sensor parameter values based on at least the first actual reading value, second actual reading value, and third actual reading. In other embodiments, the calibrated sensor parameter value is based on at least the first actual reading value and a first expected reading value, a second actual reading value and a second expected reading value, and a third actual reading value and a third expected reading value. For example, each pair of actual reading value and expected reading value associated with each simulated calibration output may be used to determine a calibration error value associated with the simulated calibration output. In some embodiments, for example a calibration error value represents a difference between the expected reading value and the actual reading value associated with a particular simulated calibration output. The calibrated sensor parameter value may then be received from a calibrated value determination formula based on the calibrated error values.

In other embodiments, the calibrated sensor parameter value is received in response to engagement with one or more sensor parameter adjustable components. For example, an operator may engage with one or more sensor parameter adjustment buttons, sensor parameter adjustment knobs, or other components, which enable input of a calibrated sensor parameter value.

The process 600 includes block 614 of setting the at least one adjustable sensor parameter associated with the sensor to the calibrated sensor parameter value. The calibrated sensor parameter is based on at least (1) the first actual reading value and the first expected reading value, (2) the second actual reading value and the second expected reading value, and (3) the third actual reading value and the third expected reading value.

In some embodiments, the calibrated sensor parameter value is stored in a non-transitory memory. The calibrated sensor parameter value may be stored associated with a corresponding adjustable sensor parameter and/or simulated calibration output (or corresponding percentage of full scale, for example), such that it may be retrieved from the non-transitory memory based on the adjustable sensor parameter. The calibrated sensor parameter value may be retrieved when the sensor device returns to measuring mode. The calibrated sensor parameter value may then be utilized to adjust values measured by the sensor. In some embodiments, one or more components of the circuitry 10 are utilized to store and/or retrieve the calibrated sensor parameter value. For example, the processor 12 and/or multi-point shunt calibration system 22 may be utilized to store one or more calibrated sensor parameter value for various adjustable sensor parameters to the multi-point shunt calibration database 24 and/or memory 14. Additionally or alternatively, the processor 12 and/or multi-point shunt calibration system 22 may be utilized to retrieve one or more calibrated sensor parameter values for various adjustable sensor parameters from the multi-point shunt calibration database 24 and/or memory 14, for example to adjust a reading value in measuring mode and/or calibration mode.

In some embodiments, a sensor device is associated with one or more adjustable sensor parameters that includes a non-linearity parameter. One or more calibrated sensor parameter value(s) may be determined and/or stored, or otherwise set, for the non-linearity parameter in a non-transitory memory, and retrieved for use in measuring mode. For example, non-linearity error may be corrected using a higher order polynomial, or by generating a calibrated lookup table defined between 0% and 100% range of the sensor device based on various actual reading values, expected reading values, and/or the calibrated sensor parameter values.

In some embodiments, an adjustable sensor parameter is utilized to inform decisions regarding the sensor device, or sub-components and/or sub-systems thereof. For example, a sensor device may be associated with one or more adjustable sensor parameters that includes a hysteresis parameter. One or more calibrated sensor parameter value(s) may be determined and/or stored, or otherwise set, for the hysteresis parameter. The calibrated sensor parameter value(s) for the hysteresis parameter may be retrieved and/or utilized by an operator and/or the sensor device to determine an overall uncertainty assigned to a reading value in measuring mode. Additionally or alternatively, the calibrated parameter value(s) for the hysteresis parameter may be utilized, for example by an operator, sensor device, or external device associated with the sensor device, to select one or more data acquisition components and/or subsystems that improve performance of the sensor device with regard to hysteresis. In some embodiments, one or more calibrated parameter value(s) for an adjustable sensor parameter may be output via a display associated with the sensor device, for example such that an operator may view the calibrated sensor value(s) for the adjustable sensor parameter and utilize the calibrated parameter value(s) for the adjustable sensor parameter to in making decisions associated with the sensor device.

The various adjustable sensor parameters may be utilized in a myriad of ways to calibrate the sensor device. Additionally or alternatively, the various adjustable sensor parameters may be utilized in a myriad of ways to inform the operator and/or a system of the sensor device regarding the accuracy of reading values produced by the sensor device. Accordingly, it should be appreciated that the particular embodiments and specific adjustable sensor parameters discussed above are non-limiting examples, and not to narrow the scope or spirit of the disclosure herein.

FIG. 8 illustrates a flowchart describing example operations for multi-point shunt calibration of a sensor device, specifically for holding the output of a simulated calibration output, in accordance with some example embodiments of the present disclosure. In some embodiments, a simulated calibration output is performed for an automatic output automatic output time shift interval, then cycled such that a new simulated calibration output is performed (e.g., outputted) based on a predefined output sequence. However, an operator may desire to continue outputting the presently outputted simulated calibration output, for example to continue outputting the presently outputted simulated calibration output while the operator adjusts one or more sensor adjustment components during calibration. In this regard, the operations of example process 700 illustrated in FIG. 8 enable holding the output of a simulated calibration output, for example by engaging a hold input associated with a calibration component and/or sensor device.

In some embodiments, the process 700 is utilized to hold output of a simulated calibration output in one of the blocks of process 600 illustrated in FIG. 7. For example, in some embodiments, output of the first simulated calibration output, output of the second simulated calibration output, or output of the third simulated calibration output is held in accordance with the process 700. It should be appreciated that, in some embodiments, the process 700 may be repeated for output of various simulated calibration outputs during one or more predefined output sequences.

The process 700 includes block 702 of receiving a hold initialization signal. In some embodiments, the hold initialization signal is received from a hold input component. For example, an operator may engage a hold input component associated with a calibration component and/or sensor device. In some embodiments, the hold input component is a hold input switch (such as an analog or digital switch). The hold initialization signal may be received in response to activation of the hold input switch (e.g., a high-low signal or a digital signal).

The process 700 includes block 704 of outputting a presently outputted simulated calibration output until a hold cancellation signal is received. In some embodiments, a calibration command control determines a current command control status signal, and continues to output the current command control status signal to cause continued outputting of the corresponding presently outputted simulated calibration output until the hold cancellation signal is received. For example, the hold initialization signal may be input into the calibration command control as a control signal.

In other embodiments, the hold initialization signal is input into a multi-point shunt calibration microcontroller as a control input. The multi-point shunt calibration microcontroller may continue to output a current representative calibration value corresponding to the presently outputted simulated calibration output until a hold cancellation signal is received.

The process 700 includes block 706 of receiving the hold cancellation signal. The hold cancellation signal is received from the hold input component. For example, an operator may disengage/deactivate the hold input component to cause the hold cancellation signal to be received. In some embodiments, the hold input component is a hold input switch (such as an analog or digital switch). The hold cancellation signal may be received in response to deactivation of the hold input switch.

The process 700 includes block 708 of outputting a next simulated calibration output. In some embodiments, the next simulated calibration output is determined based on a predefined output sequence. The predefined output sequence may then continue automatically based on an automatic output time shift interval.

Example Visualization of Automatically Output Simulated Calibration Outputs in a Predefined Output Sequence FIG. 9 illustrates a visualization of an example simulated calibration outputs in an example predefined output sequence, in accordance with some example embodiments of the present invention. The visualization 800 may be embodied by a multi-point shunt calibration apparatus including a multi-point shunt microcontroller configured for outputting various simulated output components based on an automatic output time shift interval and output step size. For example, the visualization 800 may be embodied by software for configuring the circuitry 10, the multi-point shunt calibration apparatus 200 and/or multi-point shunt calibration apparatus 300, as described above. For example, a configured multi-point shunt calibration microcontroller may be configured to automatically produce representative calibration values based on the predefined output sequence, output step size, and automatic output time shift interval, for example with the values as illustrated. As an example, the visualization 800 is described with respect to an example multi-point shunt calibration apparatus.

The multi-point shunt calibration apparatus configured embodying the visualization 800 is associated with an automatic output time shift interval of 1 second. The example multi-point shunt calibration apparatus thus outputs a simulated calibration output for 1 second before adjusting to output a new simulated calibration output that is adjacent based on the predefined output sequence. The example multi-point shunt calibration apparatus is also associated with a predefined output sequence. Specifically, the predefined output sequence includes adjustments to the simulated calibration output of an output step size of 25% of full scale for each step.

At time 0, for example, the example multi-point shunt calibration apparatus outputs an initial simulated calibration output that represents 0% of full scale associated with a given sensor device. The simulated calibration output that represents 0% of full scale is output until time 1. At time 1, the simulated calibration output is adjusted to the first intermediate simulated calibration output that represents 25% of full scale (e.g., adjusted up one output step size of 25%). The simulated calibration output that represents 25% of full scale is output until time 2. At time 2, the simulated calibration output is adjusted again to a second intermediate simulated calibration output that represents 50% of full scale (e.g., adjusted up one output step size of 25%). The simulated calibration output that represents 50% of full scale is output until time 3. At time 3, the simulated calibration output is adjusted again to a third intermediate simulated calibration output that represents 75% of full scale (e.g., adjusted up one output step size of 25%). The simulated calibration output that represents 75% of full scale is output until time 4.

At time 4, the simulated calibration output is adjusted again to a boundary simulated calibration output that represents 100% of full scale (e.g., adjusted up one output step size of 25%). The simulated calibration output that represents 100% of full scale is output until time 5. At time 5, the predefined output sequence reverses, such that each subsequent simulated calibration output represents is an output step size down until the lower boundary simulated calibration output is reached (e.g., 0% as illustrated). It should be appreciated that the simulated calibration output is adjusted down at times 5, 6, 7, and 8, similarly to the steps described above.

In some embodiments, once the predefined output sequence has performed for a complete cycle (e.g., at time 8), the predefined output sequence may repeat. For example, at time 9, the simulated calibration output may again be adjusted to a simulated calibration output that represents 25% of full scale (e.g., adjusted up one output step size of 25%). It should be appreciated that, in some embodiments, various simulated calibration outputs are output in a defined sequence associated with an output step size and an automatic output adjustment time interval continuously until calibration mode is deactivated (e.g., measuring mode is activated).

It should be appreciated that, in some embodiments, the defined sequence for a particular embodiment differs from the visualization 800. For example, the automatic output time shift interval may be longer (such as 2 seconds) or shorter (such as 0.5 seconds). Alternatively or additionally, the output step size for adjustments between simulated calibration outputs may be different. For example, in some embodiments, the output step size for adjustments between simulated calibration outputs is 10%. Alternatively or additionally still, in some embodiments, the upper and/or lower boundary simulated calibration outputs may be different. For example, in some embodiments, a lower boundary simulated calibration output is above 0% of full scale (such as 10% of full scale), and/or an upper boundary simulated calibration output is below 100% of full scale (such as 90% of full scale). Accordingly, the example parameters associated with the visualization 800 are a non-limiting example, and not to limit the scope and spirit of the disclosure.

Performing multi-point shunt calibration utilizing a predefined output sequence associated with an output step size and an automatic output adjustment time interval yields multiple benefits. Utilizing at least one intermediate simulated calibration output enables embodiments to minimize errors associated with large changes in simulated calibration outputs (e.g., hysteresis and/or non-linearity problems). Additionally, embodiments enable calibration based on multiple simulated calibration outputs, which may enhance overall calibration and minimize non-linearity, hysteresis, zero, and dead zone errors.

Conclusion

Having the benefit of the teachings presented in the foregoing descriptions and the associated drawings, many modifications and other embodiments of the present disclosure will come to mind to one skilled in the art to which this disclosure pertains. Therefore, it is to be understood that this disclosure is not limited to the specific embodiments disclosed herein, and that modifications and other embodiments are intended to be included within the scope of the appended claims. Although specific terms are employed herein, they are used in a generic and descriptive sense only and not for purposes of limitation.

What is claimed is:

1. A multi-point shunt calibration sensor device comprising:
    a measuring bridge component;
    a shunt calibration component configured to:
        determine a first actual reading value associated with a first simulated calibration output;
        determine a second actual reading value associated with a second simulated calibration output;
        determine a third actual reading value associated with a third simulated calibration output; and
        determine a calibrated reading value associated with the measuring bridge component based on the first actual reading value, second actual reading value, and third actual reading value,
        wherein the first, second, and third simulated calibration outputs are associated with different expected reading values within an operating range associated with the multi-point shunt calibration sensor device.

2. The multi-point shunt calibration sensor device of claim 1, wherein the first, second, and third simulated calibration outputs may be associated with an automatic output shift time interval.

3. The multi-point shunt calibration sensor device of claim 1, wherein the shunt calibration component is further configured to:
    determine at least one additional actual reading value associated with at least one additional simulated calibration output, wherein the calibrated reading value is based on the at least one additional actual reading value.

4. The multi-point shunt calibration sensor device of claim 1, wherein the first actual reading value is associated with a first expected reading value, the second actual reading value is associated with a second expected reading value, and the third actual reading value is associated with a third expected reading value.

5. The multi-point shunt calibration sensor device of claim 4, wherein the calibrated reading value is based on a first error value that depends upon the first actual reading value and the first expected reading value, a second error value based on the second actual reading value and the second expected reading value, and a third error value based on the third actual reading value and the third expected reading value.

6. The multi-point shunt calibration sensor device of claim 1, wherein the shunt calibration component is configured to:
    set one or more calibrated sensor parameter values for one or more adjustable sensor parameters associated with the multi-point shunt calibration sensor device; and
    store the one or more calibrated sensor parameter values in a database when the multi-point shunt calibration sensor device is in a calibration mode.

7. A sensor device comprising:
at least a measuring bridge component and a shunt calibration component, wherein the shunt calibration component is configured to:
determine a first actual reading value associated with a first simulated calibration output;
determine a second actual reading value associated with a second simulated calibration output;
determine a third actual reading value associated with a third simulated calibration output; and
determine a calibrated reading value associated with the measuring bridge component based on the first actual reading value, second actual reading value, and third actual reading value,
wherein the first, second, and third simulated calibration outputs are associated with different expected reading values within an operating range associated with the sensor device.

8. The sensor device of claim 7, wherein the first actual reading value represents a sensor output at 0%, the second actual reading value represents the sensor output at 50%, and the third actual reading value represents the sensor output at 100%.

9. The sensor device of claim 7, wherein the shunt calibration component is configured to set one or more calibrated sensor parameter values for one or more adjustable sensor parameters associated with the sensor device.

10. The sensor device of claim 9, wherein the shunt calibration component is configured to store the one or more calibrated sensor parameter values in a database when the sensor device is in a calibration mode.

11. The sensor device of claim 10, wherein when the sensor device is in a measuring mode, the shunt calibration component is configured to access the one or more calibrated sensor parameter values to produce calibrated reading values for the sensor device.

12. The sensor device of claim 11, wherein the one or more calibrated sensor parameter values are based on one or more of actual reading values and/or expected reading values at different points in a predefined output sequence.

13. The sensor device of claim 11, wherein the one or more calibrated sensor parameter values for a hysteresis parameter is displayed to an operator via a display associated with the sensor device.

14. The sensor device of claim 7, wherein the shunt calibration component is configured determine at least one additional actual reading value associated with at least one additional simulated calibration output, where the calibrated reading value is further based on the at least one additional actual reading value.

15. A multi-point shunt calibration method comprising:
determining a first actual reading value associated with a first simulated calibration output;
determining a second actual reading value associated with a second simulated calibration output;
determining a third actual reading value associated with a third simulated calibration output; and
determining a calibrated reading value associated with a measuring bridge component based on the first actual reading value, second actual reading value, and third actual reading value,
wherein the first, second, and third simulated calibration outputs are associated with different expected reading values within an operating range associated with a multi-point shunt calibration sensor device.

16. The multi-point shunt calibration method of claim 15, wherein the first, second, and third simulated calibration outputs may be associated with an automatic output shift time interval.

17. The multi-point shunt calibration method of claim 15, further comprising:
determining at least one additional actual reading value associated with at least one additional simulated calibration output, wherein the calibrated reading value is based on the at least one additional actual reading value.

18. The multi-point shunt calibration method of claim 15, wherein the first actual reading value is associated with a first expected reading value, the second actual reading value is associated with a second expected reading value, and the third actual reading value is associated with a third expected reading value.

19. The multi-point shunt calibration method of claim 15, further comprising:
setting one or more calibrated sensor parameter values for one or more adjustable sensor parameters associated with the multi-point shunt calibration sensor device.

20. The multi-point shunt calibration method of claim 19, further comprising:
storing the one or more calibrated sensor parameter values in a database when the multi-point shunt calibration sensor device is in a calibration mode.

* * * * *